(12) United States Patent
Saito

(10) Patent No.: US 7,156,680 B2
(45) Date of Patent: Jan. 2, 2007

(54) INSERT AND ELECTRONIC COMPONENT HANDLING APPARATUS PROVIDED WITH THE SAME

(75) Inventor: Noboru Saito, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/929,724

(22) Filed: Aug. 31, 2004

(65) Prior Publication Data

US 2005/0202716 A1   Sep. 15, 2005

(51) Int. Cl.
*H01R 13/62* (2006.01)
(52) U.S. Cl. ...................................... 439/331
(58) Field of Classification Search ............. 439/330, 439/331, 68–73
See application file for complete search history.

(56) References Cited

U.S. PATENT DOCUMENTS 5,452,183 A * 9/1995 Renn et al. ................ 361/789
6,651,817 B1 * 11/2003 Shim et al. ................. 206/726

\* cited by examiner

*Primary Examiner*—Ross Gushi
(74) *Attorney, Agent, or Firm*—Posz Law Group, PLC

(57) ABSTRACT

To provide a guide core capable of being detachably attached to an insert body and an insert body to which the guide core can be detachably attached, the present invention provides a guide core able to be attached in a detachable way to an insert body, comprising a supporting portion capable of supporting an external terminal face of an area array type electronic component so that external terminals of the area array type electronic component are exposed to the direction of connection terminals of a socket, and a hook receiver able to be engaged in a releasable way with a hook portion provided to the insert body, and an insert body able to be attached in a detachable way with the guide core, comprising an electronic component guide portion comprising a guide core attachment socket to which the guide core is attached, and an electronic component inlet connected with the guide core attachment socket so that an electronic component can be guided to the guide core attached to the guide core attachment socket, and a hook portion able to be engaged in a releasable way with a hook receiver provided to the guide core.

22 Claims, 19 Drawing Sheets

(a)

(b)

(a)

(b)

(a)

(b)

(a)

(b)

INSERT AND ELECTRONIC COMPONENT HANDLING APPARATUS PROVIDED WITH THE SAME

FIELD OF THE INVENTION

The present invention relates to an electronic component holder (insert) capable of holding an electronic component to be tested while conducting a test on the electronic component by an electronic component testing apparatus, and an electronic component handling apparatus using the same.

BACKGROUND OF THE INVENTION

In a production process of semiconductor devices, etc., an electronic component testing apparatus is necessary for testing performance and functions of IC devices and other electronic components. As an example of an electronic component testing apparatus as such, an electronic component testing apparatus comprising an electronic component handling apparatus, an electronic component contact apparatus and a testing main apparatus is known.

As an example of the electronic component handling apparatus, there is known an IC device handling apparatus called a handler for applying a variety of temperature stress, such as a low temperature and high temperature, to an IC device to be tested, mounting the device on a socket, then classifying and holding the IC device to be tested in accordance with the test result. As an example of the electronic component contact apparatus, an IC device contact apparatus for bringing an IC device to be tested to (electrically) contact a main testing apparatus via a socket and a test head is known.

A test of an IC device using the handler is conducted, for example, as below. The IC device to be tested is, after being conveyed to above a test head provided with an IC socket, pressed by a pusher so as to be loaded on the IC socket. As a result, connection terminals of the IC socket contact external terminals of the IC device to be tested, and the IC device to be tested is electrically connected to the main testing apparatus through the IC socket and the test head. Then, a test signal supplied from the main testing apparatus to the test head through a cable is applied to the IC device to be tested and a response signal read from the IC device to be tested is sent to the main testing apparatus through the test head, so that electrical characteristics of the IC device to be tested is measured.

In the test of IC devices to be tested by using a handler, IC devices to be tested are held on a tray to be conveyed to inside the handler and, after the test is completed, the IC devices are reloaded to categorically separated trays in accordance with the respective test results. When a type of a tray to hold the IC devices before and after the test (hereinafter, also referred to as a "customer tray") and that of the tray to circularly convey inside the handler (hereinafter, also referred to as a "test tray") are different, the IC devices are reloaded between the customer tray and the test tray before and after the test.

A plurality of electronic component holders called inserts are provided on the test tray and the IC devices to be tested are held in the inserts provided on the test tray, conveyed to the test head and pressed against the test head while held in the inserts. By using the test tray with the plurality of inserts, a large number of IC devices can be measured at a time.

There are a variety of configurations of the inserts corresponding to package types, etc. of the IC devices to be tested. For example, as shown in FIG. 19, a device guide portion 171a for guiding the IC device to be tested 2 to a guide core 18 is formed on an insert body 17 of the insert 16 for holding an area array type electronic component, such as a BGA type IC device, and the IC device 2 is guided by the device guide portion 171a to be held in the guide core 18. At the lower end of the guide core 18 is formed an opening 182 so that external terminals 22 of the IC device 2 can be exposed to the direction of connection terminals of a socket. An external terminal face of the IC device 2 (a face arranged with the external terminals 22 among outer surfaces of a package body of the IC device 2) is supported by a rim of the opening 182.

Also, the insert 16 is provided with a latch mechanism (for example, disclosed in the Japanese Unexamined Publication No. 2001-33518) for preventing the IC device 2 held in the guide core 18 from jumping out or deviating from the position. The latch mechanism is provided with a latch 175, wherein a latch portion 175b is formed at one end, arms 175d and 175e are connected thereto, and the arm 175d has a power point 175a. The arm 175d is formed a through hole 175f as a rotation center, and the latch 175 is supported rotatable about the insert body 17 as a result that a pin is inserted to the through hole 175f. In the latch mechanism, when an outer force is applied from the power point 175a as a lever plate 19 approaches to the insert body 17, the latch portion 175b moves to a position (closed position) of preventing the IC device 2 from jumping out or deviating by covering an upper face of the device 2 held in the guide core 18 as shown in FIG. 19(a). When the application of the outer force to the power point 175a is released as the lever plate 19 recedes from the insert body 17, the latch portion 175b leaves from the upper face of the device 2 held in the guide core 18 to move to a position (open position) of enabling the IC device 2 to be carried out and in.

In the insert 16, as shown in FIG. 19, the insert body 17 and the guide core 18 are integrally formed and the guide core 18 cannot be exchanged. A size of an IC device able to be held in the insert 16 is determined in accordance with the configuration of the guide core 18, so that a size of the IC device able to be held in the insert 16 is limited because the guide core 18 cannot be exchanged. Therefore, a different insert 16 has to be prepared for each size of the IC devices. However, since the configuration other than the guide core 18 of the insert 16 may be substantially the same regardless of a size of the IC device, it is inefficient to prepare different insert for each size of the IC devices.

Also, in the case where the insert 16 can hold a variety of sizes of IC devices, a latch mechanism capable of dealing with the variety of sizes of IC devices, that is a latch mechanism having a large open/close amount (a moving amount between the open position and the closed position) of the latch portion 175b, becomes necessary. The open/close amount of the latch portion 175b can be made large by making a rotation angle of the latch 175 large. However, in the latch 175 shown in FIG. 19, since the power point 175a receiving an action from the lever plate 19 is provided on the arm 175d, the lever plate 19 approached to the insert body 17 not only acts on the power point 175a but interferes with the arms 175d and 175e to end up in limiting rotation of the arms 175d and 175e. When rotation of the arms 175d and 175e is limited, rotation of the latch portion 175b is also limited and a rotation angle of the latch portion 175b cannot be made large.

SUMMARY OF THE INVENTION

Thus, a first object of the present invention is to provide a guide core able to be detachably attached to the insert body.

A second object of the present invention is to provide an insert body able to be attached with the guide core in a detachable way.

Furthermore, a third object of the present invention is to provide an insert body provided with a latch mechanism capable of dealing with a variety of sizes of IC devices, wherein a guide core can be detachably attached and an open/close amount of a latch portion is large.

Furthermore, a fourth object of the present invention is to provide an insert provided with the above guide core and insert body and an electronic component handling apparatus provided with the insert.

To attain the above objects, a guide core, insert body, insert and electronic component handling apparatus provided by the present invention have the following characteristics.

(1) A guide core according to the present invention able to be attached in a detachable way to an insert body, comprising a supporting portion capable of supporting an external terminal face of an area array type electronic component so that external terminals of the area array type electronic component are exposed to the direction of connection terminals of a socket, and a hook receiver able to be engaged in a releasable way with a hook portion provided to the insert body.

In the present invention, the "insert" means an electronic component holder capable of holding an electronic component to be tested while conducting a test on the electronic component to be tested by an electronic component testing apparatus, the "insert body" means an insert component capable of being attached with a guide core and guiding the electronic component to be tested to the attached guide core, and the "guide core" means an insert component capable of supporting an electronic component to be tested so that the electronic component to be tested can be subjected to a test by an electronic component testing apparatus. Note that the above definitions of the "insert", "insert body" and "guide core" are not to limit functions of the inert, insert body and guide core.

A guide core according to the present invention is attached to an insert body and an electronic component to be tested is guided to the guide core attached to the insert body by the insert body. Furthermore, the electronic component to be tested is supported by a supporting portion of the guide core so that the external terminals are exposed to the direction of connection terminals of a socket. As a result, the external terminals of the electronic component to be tested can be connected to the connection terminals of the socket to conduct a test on the electronic component in a state that the electronic component is supported by the guide core.

An electronic component as an object of the guide core according to the present invention is an area array type electronic component. Here, the "area array type electronic component" means an electronic component wherein external terminals are arranged (for example in matrix) on an outer face of a package body thereof and the kind is not particularly limited and, as representative examples, IC devices of a BGA (ball grid array), LGA (land grid array), PGA (pin grid array) and CSP (chip size package), etc. may be mentioned. Also, a shape of the external terminals of the area array type electronic component is not particularly limited and, for example, external terminals having a shape of a ball, land and pin, etc. may be mentioned. Also, the "external terminal face of an area array type electronic component" means a face arranged with external terminals among outer surfaces of a package body of the area array type electronic component.

The configuration of a supporting portion of a guide core according to the present invention is not particularly limited as far as the outer terminal face of the area array type electronic component can be supported so that external terminals of the area array type electronic component are exposed to the direction of connection terminals of a socket. As an example of the configuration as such, the configuration having an opening by which the external terminals of the area array type electronic component are exposed to the direction of connection terminals of a socket and the external terminal face of the area array type electronic component is supported by a rim of the opening may be mentioned.

The configuration of a hook receiver provided to the guide core according to the present invention is not particularly limited as far as being able to be engaged with the hock portion provided to the insert body so that the guide core is detachably attached to the inert body. Also, a position and the number of the hook receiver are not particularly limited as far as the guide core can be attached to the insert body due to an engagement of the hook portion with the hook receiver. For example, the guide core according to the present invention can be attached to the insert body in a stable state by providing at least one hook receiver at mutually opposite positions on the rim of the supporting portion.

The guide core according to the present invention is attached to the insert body as a result of engaging the hook portion of the insert body with the hook receiver of the guide core and detached from the insert body as a result of releasing the engagement of the hook portion of the insert body with the hook receiver of the guide core. Accordingly, by using the guide core according to the present invention, an inert capable of exchanging the guide core can be produced. Furthermore, in an insert using the guide core according to the present invention, a variety of sizes of electronic components can be held only by exchanging the guide core.

(2) In a preferable embodiment of the guide core described in the above (1), the guide core comprises a hook insertion hole to which the hook portion can be inserted, and the hook receiver can engage with the hook portion inserted to the hook insertion hole.

The hook insertion hole provided to the guide core according to the present embodiment is not particularly limited in its shape, configuration, size and position, etc. as far as the hook portion provided to the insert body can be inserted and can be suitably determined in accordance with a shape, configuration, size and position, etc. of the hook portion provided to the insert body. The hook insertion hole may be, for example, a concave portion or a through hole. The hook insertion hole may be provided, for example, at least one at opposing positions on a flange provided around the supporting portion.

In the guide core according to the present embodiment, the position the hook receiver is provided is not particularly limited as far as the hook receiver can engage with the hook portion inserted to the hook insertion hole. The hook receiver may be provided, for example, near an exit of the hook insertion hole so as to be connected with an inner surface of the hook insertion hole.

In the guide core according to the present embodiment, since the hook receiver is provided so as to be able to engage with the hook portion inserted to the hook insertion hole, the guide core can be attached close to the insert body. As a result, an electronic component can be surely guided from the insert body to the guide core.

(3) In a preferable embodiment of the guide core described in the above (1) or (2), the guide core comprises a guide shaft fitting hole for fitting a guide shaft which can locate the guide core with the socket.

In the guide core according to the present embodiment, accurate locating of the guide core with the socket can be made by fitting the guide shaft provided on the socket side (for example, provided on a socket guide) with the guide shaft fitting hole. As a result, accurate locating of an electronic component to be tested supported by the guide core with the socket is made and external terminals of the electronic component can be surely connected to connection terminals of the socket.

(4) The insert body according to the present invention is an insert body able to be attached in a detachable way with the guide core as set forth in any one of the above (1) to (3), comprising an electronic component guide portion comprising a guide core attachment socket to which the guide core is attached, and an electronic component inlet connected with the guide core attachment socket so that an electronic component can be guided to the guide core attached to the guide core attachment socket, and a hook portion able to be engaged in a releasable way with a hook receiver provided to the guide core.

In the insert body according to the present invention, an electronic component guide portion comprises a guide core attachment socket and an electronic component inlet. The guide core attachment socket and the electronic component inlet are connected so that an electronic component entering from the electronic component inlet can be guided to the guide core attached to the guide core attachment socket.

A guide core is attached to the guide core attachment socket of the insert body according to the present invention, and an electronic component to be tested guided by the electronic component guide portion of the insert body is carried to the guide code attached to the guide core attachment socket. Then, the electronic component to be tested is subjected to a test by an electronic component testing apparatus while supported by the guide core. The electronic component after tested is taken out from the insert body through the electronic component inlet by being guided by the electronic component guide portion.

The configuration of the hook portion of the insert body according to the present invention is not particularly limited as far as being able to detachably engage with the hook receiver provided to the guide core so that the guide core can be detachably attached to the insert body. Also, a position and the number of the hook portion may be suitably determined in accordance with a position and the number of the hook receiver provided to the guide core.

In the insert body according to the present invention, a guide core is attached thereto as a result that the hook portion of the insert body engages with the hook receiver of the guide core, and the guide core is detached from the insert body as a result of releasing the engagement of the hook portion of the insert body with the hook receiver of the guide core. Accordingly, by using the insert body according to the present invention, an insert having an exchangeable guide core can be produced. An insert using the inert body according to the present invention is capable of holding a variety of sizes of electronic components to be tested only by exchanging the guide core.

(5) In a preferable embodiment of the insert body described in the above (4), the hook portion can be inserted to the hook insertion hole provided to the guide core and can engage with the hook receiver in a state of being inserted in the hook insertion hole.

A shape, configuration, size and position, etc. of the hook portion provided to the insert body according to the present embodiment are not particularly limited as far as being capable of being inserted to a hook insertion hole of the guide core and engaging with the hook receiver in a state of being inserted in the hook insertion hole and may be suitably determined in accordance with a shape, configuration, size and position, etc. of the hook insertion hole and the hook receiver provided on the guide core.

In the insert body according to the present embodiment, since the hook portion is provided so as to be able to engage with the hook receiver in a state of being inserted in the hook insertion hole, the guide core can be attached close to the insert body. Consequently, an electronic component can be surely guided from the insert body to the guide core.

Note that when the hook receiver is provided near an exit of the hook insertion hole, the hook portion engages with the hook receiver in a state of protruding from the exit of the hook insertion hole in some cases. Even such a case is included in the state of "being engaged with the hook receiver in a state of being inserted in the hook insertion hole" as far as the hook portion engages with the hook receiver in a state of being inserted from an entrance of the hook insertion hole.

(6) In a preferable embodiment of the insert body described in the above (4) or (5), the hook portion can move in the direction for engaging with the hook receiver.

In the inert body according to the present embodiment, the guide core can be attached to the insert body by moving the hook portion to the direction for engaging with the hook receiver, and the guide core can be detached from the insert body by moving the hook portion to the opposite direction (the direction for releasing the engagement with the hook receiver), so that attachment and detachment (exchange) of the guide core to and from the insert body can be performed easily.

(7) In a preferable embodiment of the insert body described in the above (6), the hook portion can rotate on a rotation axis.

In the insert body according to the present embodiment, since the hook portion moves on a constant orbit about the rotation axis, the hook portion can be easily and surely moved to the direction for engaging with the hook receiver and to the opposite direction (the direction for releasing the engagement with the hook receiver). As a result, attachment and detachment (exchange) of the guide core to and from the insert body can be easily and surely performed.

(8) In a preferable embodiment of the insert body described in the above (6) or (7), the hook portion is biased by an elastic member in the direction for engaging with the hook receiver.

In the insert body according to the present embodiment, a kind of the elastic member and a position the elastic member is placed, etc. are not particularly limited as far as it can bias the hook portion in the direction for engaging with the hook receiver. As the elastic member, a spring, such as a torsion spring can be used.

In the insert body according to the present embodiment, engagement of the hook portion with the hook receiver becomes firm due to a biasing force of the elastic member and the guide core can be attached to the insert body in a stable state.

(9) In a preferable embodiment of the insert body described in the above (8), the insert body comprises a stopper portion for limiting movement or rotation of the hook portion in the direction for engaging with the hook receiver.

In the insert body according to the present embodiment, the hook portion can be held at a stopper portion even in a state that the guide core is not attached.

In the insert body according to the present embodiment, when bringing the hook portion and the hook receiver engaged, an outer force is brought to act on the hook portion held by the stopper portion to move or rotate the hook portion to the direction for releasing the engagement with the hook receiver, then, the guide core is moved to the guide core attachment socket of the insert body and the outer force is released. The hook portion released from the outer force moves or rotates to the direction for engaging with the hook receiver by the biasing force of the elastic member and engages with the hook receiver. At this time, the hook portion engages with the hook receiver at the stage before the movement or rotation to the direction for engaging with the hook receiver is not limited by the stopper portion or engages with the hook receiver in a state that the movement or rotation to the direction for engaging with the hook receiver is limited by the stopper portion.

In the insert body according to the present embodiment, the configuration of the stopper portion is not particularly limited as far as being able to limit the movement or rotation of the hook portion. Also, a position of the stopper portion is not particularly limited as far as it does not hindering the engagement of the hook portion with the hook receiver.

(10) In a preferable embodiment of the insert body described in the above (9), the insert body comprises a jig receiver which is connected with the hook portion and can move or rotate the hook portion in the direction for releasing the engagement with the hook receiver by receiving a pressure from a jig.

In the insert body according to the present embodiment, a shape and configuration, etc. of a jig receiver are not particularly limited as far as the hook portion can be moved or rotated to the direction for releasing the engagement with the hook receiver by receiving a pressure from the jig. Also, a shape and configuration, etc. of the jig are not particularly limited as far as being able to pressing the jig receiver. As the jig, for example, those having a shaft for pressing the jig receiver can be used.

In the insert body according to the present embodiment, the jig receiver is connected with the hook portion and can move or rotate together with the hook portion and when the jig receiver receives a pressing force from the jig, the hook portion moves or rotates to the direction for releasing the engagement with the hook receiver. After that, when the pressing force from the jig is released, the hook portion moves or rotates to the direction for engaging with the hook receiver by a biasing force of the elastic member. Accordingly, in the insert body according to the present embodiment, attachment and detachment (exchange) of the guide core to and from the insert body can be performed easily by using the jig.

(11) In an preferred embodiment of the insert body described in the above (10), the insert body comprises a jig insertion hole to which the jig can be inserted, and the jig inserted to the jig insertion hole can press the jig receiver.

In the insert body according to the present embodiment, the jig receiver can be pressed by inserting the jig to the jig insertion hole, and the pressure against the jig receiver can be released by receding the jig from the jig insertion hole. Accordingly, in the insert body according to the present embodiment, attachment and detachment (exchange) of the guide core to and from the insert body can be easily performed by insertion and recession of the jig to and from the jig insertion hole.

(12) In a preferred embodiment of the insert body described in the above (11), the jig inserted to the jig insertion hole can press the jig receiver as a result that the jig inserted to the jig insertion hole contacts the jig receiver and slides on the jig receiver.

In the insert body according to the present embodiment, the jig receiver is provided so as to block insertion of the jig from the jig insertion hole, for example, in the state that the hook portion is held by the stopper portion. Specifically, the jig receiver having a face to be contacted by the jig is provided so as to cross over the jig insertion hole while inclining to the direction for engaging the hook portion with the hook receiver. The jig inserted to the jig insertion hole contacts the jig receiver and slides on the jig receiver while pressing against the jig receiver to the moving direction of the jig. As a result, a force to the direction for releasing the engagement of the hook portion with the hook receiver is applied to the jig receiver, and the hook portion together with the jig receiver moves or rotates to the direction for releasing the engagement of the hook portion with the hook receiver. When the jig is receded from the jig insertion hole, the pressing force applied to the jig receiver by the jig is released and the hook portion moves or rotates to the direction for engaging with the hook receiver due to a biasing force of the elastic member. Accordingly, in the insert body according to the present embodiment, attachment and detachment (exchange) of the guide core to and from the insert body can be easily and surely performed by using the jig.

(13) In a preferred embodiment of the insert body described in any one of the above (4) to (12), the insert body comprises a latch mechanism comprising a driver action portion which can rotate by receiving an action from a driver moving close to and away from the insert body to the direction in which the driver moves close to the insert body, a latch portion which can rotate between an open position for making the electronic component guide portion to be in an open state and a closed position for making the same to be in a closed state, and an arm which can interlock rotation of the drive action portion and rotation of the latch portion, and when the driver is at the most distant position, the driver action portion is positioned close to the driver than to a plane which includes a rotation axis of the driver action portion and which is perpendicular with the direction in which the driver moves close to and away from the insert body, and is positioned near a plane which includes a rotation axis of the driver action portion and which is in parallel with the direction in which the driver moves close to and away from the insert body, and the driver can move without interfering with the arm.

In the insert body according to the present embodiment, a driver is, for example, provided so as to move close to and away from an electronic component approaching face of the insert body. Here, the "electronic component approaching face" means an outer face on which an electronic component inlet of an electronic component guide portion is provided among outer surfaces of the insert body. When the driver is provided so as to move close to and away from an electronic component approaching face of the insert body, the configuration, position, etc. of the driver are adjusted so as not to hinder taking in and taking out of an electronic component through the electronic component inlet. For example, by providing on the driver an opening connected to the electronic component inlet, taking in and taking out of an electronic component through the electronic component inlet becomes possible. For example, at the time of carrying the electronic component to be tested to an insert, the driver receives a pressing force from an apparatus for carrying the electronic component to be tested into the insert and moves close to the insert body. The driver is preferably biased to the direction in which the driver moves away from the insert body by a spring or other elastic member so that the driver can move away from the insert body when the pressing force from the above apparatus is released. Note that a state where the driver is at the most distant position from the insert body is called "a driver in the most distant position".

In the insert body according to the present embodiment, as a specific example of the driver, a lever plate may be mentioned. A lever plate may directly acts on a driver action portion or indirectly acts via another member. For example, the lever plate may be provided with a protrusion for acting on the driver action portion.

In the insert body according to the present embodiment, the driver action portion rotates on a rotation axis by receiving an action from the driver to the direction in which the driver moves close to the insert body. The driver action portion may rotate by receiving an action from the driver to the direction in which the driver moves away from the insert body.

In the insert body according to the present embodiment, rotation movement of the driver action portion and rotation movement of the latch portion work together and when the driver action portion rotates by receiving an action from the driver to the direction in which the driver moves close to the insert body, the latch portion rotate from an open position to a closed position or from the closed position to the open position. Here, the "open position" indicates a position to make the electronic component guide portion to be in an open state and the "open state" indicates a state that the electronic component can be carried to and out from the guide core by being guided by the electronic component guide portion. The "closed position" means a position to make the electronic component guide portion to be in a closed state and the "closed state" means a state that the electronic component cannot be carried to and out from the guide core by being guided by the electronic component guide portion. When the latch portion is at the open position, the electronic component can be carried to the guide core by being guided by the electronic component guide portion and carried out from the guide core by being guided by the electronic component guide portion. Also, when the latch portion is at the closed position, the electronic component cannot be guided by the electronic component guide portion (that is, the electronic component cannot pass through the electronic component guide portion), so that it is possible to prevent the electronic component supported by the guide core attached to the guide core attachment socket of the insert body from jumping out. In the case that an end of the latch portion rotates, for example, between near the center portion of the guide core attachment socket and near the inner surface of the electronic component guide portion, when the end of the latch portion is positioned near the center portion of the guide core attachment socket, the latch portion is at the "closed position", while when the end of the latch portion is positioned near the inner surface of the electronic component guide portion, the latch portion is at the "open position".

In the inert body according to the present embodiment, when the latch portion is at the closed position, the end of the latch portion is preferably able to press the electronic component supported by the guide core attached to the guide core attachment socket of the insert body in the direction of a supporting portion of the guide core, and thereby, the electronic component is held at a predetermined position of the guide core and positional deviation of the electronic component can be prevented. For example, as a result that the end of the latch portion presses against an outer surface facing to the direction of the electronic component inlet of the electronic component supported by the guide core attached to the guide core attachment socket of the insert body, positional deviation of the electronic component can be prevented. Note that in the case that the end of the latch portion is able to press the electronic component supported by the guide core, rotating movement of the latch portion is limited as a result that the end of the latch portion contacts the electronic component, and the close position of the latch portion when the electronic component is not supported by the guide core and the closed position of the latch portion when the electronic component is supported by the guide core are different in some cases, but as far as it is a position of making the electronic component guide portion in a closed state, it is included in the "closed position". Also, the closed position of the latch portion may be different due to a size of the electronic component to be supported by the guide core in some cases, but as far as it is a position to making the electronic component guide portion in a closed state, it is included in the "closed position".

In the insert body according to the present embodiment, the rotation axis of the driver action portion and the rotation axis of the latch portion are provided, for example, on the inner surface of the electronic component guide portion, preferably vertical or approximately vertical with the direction in which the driver moves close to and away from the insert body. Also, the rotation axis of the driver action portion and the rotation axis of the latch portion may be different, but it is preferably the same (that is, it is preferable that the rotation axis of the driver action portion and the rotation axis of the latch portion are identical). By making the rotation axis of the two the same, rotation movement of the two can be interlocked by a simple mechanism. When the rotation axis of the two are the same, the rotation movement of the two can be interlocked, for example, by connecting the driver action portion and the latch portion with an arm.

In the insert body according to the present embodiment, the configuration and arrangement, etc. of the arm are adjusted so as not to hinder carrying in and out of the electronic component through the electronic component inlet. The arm is provided, for example, along the inner surface of the electronic component guide portion at the time the driver is at the most distant position.

In the insert body according to the present embodiment, when the driver is at the most distant position, the driver action portion is positioned closer to the driver than to a plane which includes the rotation axis of the driver action portion and which is perpendicular with the direction in which the driver moves close to and away from the insert body, so that the driver action portion received an action to the direction in which the driver moves close to the insert body rotates toward the plane which includes the rotation axis of the driver action portion and which is perpendicular with the direction in which the driver moves close to and away from the insert body. When the driver action portion rotates as such, the closer the driver action portion is to a plane which includes the rotation axis of the driver action portion and which is in parallel with the direction in which the driver moves close to and away from the insert body at the time that the driver is at the most distant position, the larger a rotation angle of the driver action portion becomes. In the insert body according to the present embodiment, the driver is positioned near the plane which includes the rotation axis of the driver action portion and which is in parallel with the direction in which the driver moves close to and away from the insert body, so that the rotation angle of the driver action portion becomes large. Rotating movement of the latch portion is interlocked with the rotating movement of the driver action portion and the larger the rotation angle of the driver action portion, the larger the rotation angle of the latch portion, so that the rotation angle of the latch portion becomes large in the insert body according to the present embodiment. Accordingly, in the insert body according to the present embodiment, an opening/closing amount (a move amount between the open position and the closed position) of the latch portion is large and a variety of sizes of electronic components can be prevented from jumping out and deviating from the position.

Also, since the driver moves so as not to interfere with the arm, the driver does not hinder an operation of the arm and rotation movement of the driver action portion and the rotation movement of the latch portion can be surely interlocked by the arm. Thus, a large opening/closing amount of the latch portion can be secured.

(14) In a preferred embodiment of the insert body described in the above (13), the driver action portion is biased by an elastic member to the direction in which the driver moves away from the insert body.

In the insert body according to the present embodiment, when the driver moves away from the insert body, the driver action portion receives an action from the elastic body to the direction in which the driver moves away from the insert body, and rotates in the opposite direction from the rotating movement of the driver action portion brought by approaching of the driver. At this time, the latch portion is also interlocked with the rotating movement of the driver action portion and rotates in the opposite direction from the rotating movement of the latch portion brought by approaching of the driver. Namely, when the latch portion rotates from the open position to the closed position along with approaching of the driver, the latch portion rotates from the closed position to the open position along with deviating of the driver. When the latch portion rotates from the closed position to the open position along with approaching of the driver, the larch portion rotates from the open position to the closed position along with deviating of the driver. Accordingly, in the insert body according to the present embodiment, by moving the driver close to and away from the insert body, the latch portion rotated from the open position to the closed position can be rotated again to the open position, or the latch portion rotated from the closed position to the open position can be rotated again to the closed position.

(15) In a preferred embodiment of the insert body described in the above (13) or (14), when the driver is at the most distant position, the driver action portion is positioned near the driver.

In the insert body according to the present embodiment, since the distance the driver moves while acting on the driver action portion becomes long, the rotation angle of the driver action portion due to the act of the driver also becomes large, so that the rotation angle of the latch portion rotating together with the driver action portion also becomes large. Accordingly, in the insert body according to the present embodiment, an opening/closing amount (a move amount between the open position and closed position) of the latch portion becomes large, so that it is possible to prevent a variety of sizes of electronic components from jumping out and deviating from the position.

(16) In a preferred embodiment of the insert body described in any one of the above (13) to (15), when the driver action portion rotates by receiving an action from the driver to the direction in which the driver moves close to the insert body, the rotation of the driver action portion and the rotation of the latch portion are interlocked so that the latch portion can rotate from the closed position to the open position.

In the insert body according to the present embodiment, when carrying an electronic component to be tested into the insert, an apparatus for carrying the electronic component to be tested into the insert is moved close to the electronic component approaching face, the driver is pressed by the apparatus, and the driver is moved close to the electronic component approaching face, so that the latch portion can be rotated from the closed position to the open position. Accordingly, in the insert body according to the present embodiment, an operation of the apparatus for carrying the electronic component to be tested into the insert and the rotation movement of the latch portion are interlocked, and at the time of carrying the electronic component to be tested into the insert by the apparatus, the latch portion can be rotated to the open position, so that the electronic component can be surely carried into the insert by using the apparatus.

(17) In a preferred embodiment of the insert body described in any one of the above (13) to (16), the rotation axis of the driver action portion and the rotation axis of the latch portion are identical.

In the insert body according to the present embodiment, since the rotation axis of the driver action portion and that of the latch portion are the same, the configuration of the latch mechanism can be simplified.

(18) In a preferred embodiment of the insert body described in the above (17), when the driver is at the most distant position, the driver action portion and the latch portion are positioned on opposite sides of a plane which includes the rotation axis and which is perpendicular with the direction in which the driver moves close to and away from the insert body.

In the insert body according to the present embodiment, a position of the latch at the time that the driver is at the most distant position is the closed position. Accordingly, when the driver action portion rotates by receiving an action from the driver to the direction in which the driver moves close to the insert body, the rotation movement of the driver action portion and that of the latch portion can be interlocked, so that the latch portion can rotate from the closed position to the open position.

(19) In a preferred embodiment of the insert body described in the above (17) or (18), the rotation axis is positioned near the electronic component inlet, and when the driver is at the most distant position, an end of the latch portion is positioned close to a plane which includes the rotation axis and which is in parallel with the direction in which the driver moves close to and away from the insert body, and the end of the latch portion is positioned near the guide core attachment socket.

In the insert body according to the present embodiment, as a result that an end of the latch portion at the closed position is positioned close to the plane which includes the rotation axis and which is in parallel with the direction in which the driver moves close to and away from the insert body and the end of the latch portion is positioned near the guide core attachment socket, a moving distance of the end of the latch portion along with the rotation movement of the latch portion is long, so that the opening/closing amount of the latch portion is large.

(20) In a preferred embodiment of the insert body described in any one of the above (17) to (19), when the driver is at the most distant position, the driver action portion and the arm portion are positioned on opposite sides of a plane which is perpendicular with the rotation axis and which is in parallel with the direction in which the driver moves close to and away from the insert body.

In the insert body according to the present embodiment, an orbit of the driver action portion and an orbit of the arm drawn along with movement of the driver are positioned on opposite sides of a plane which is perpendicular with the rotation axis and which is in parallel with the direction in which the driver moves close to and away from the insert body, so that the driver can move while acting on the driver action portion by not acting on the arm. As a result, rotation movement of the driver action portion and that of the latch portion can be surely interlocked by the arm, so that a large opening/closing amount of the latch portion can be secured.

Note that the insert body according to the present embodiment, it is sufficient if the driver action portion and the arm are positioned on opposite sides of any plane satisfying the condition of "a plane which is perpendicular with the rotation axis and which is in parallel with the direction in which the driver moves close to and away from the insert body".

In the insert body according to the present embodiment, for example, when the driver is at the most distant position, if the arm is provided with a protrusion having an end existing between the driver and the electronic component approaching face, the end of the protrusion provided to the arm becomes a driver action portion, and the driver action portion and the arm are positioned on the opposite sides of a plane which is perpendicular with the rotation axis and which is in parallel with the direction in which the driver moves close to and away from the insert body.

(21) In a preferred embodiment of the insert body described in any one of the above (4) to (20), the insert body comprises a holder capable of holding the driver action portion so that the driver action portion can rotate without interfering with the insert body.

In the insert body according to the present embodiment, a holder can be provided, for example, as a concave portion capable of holding the driver action portion at a rim of the electronic component inlet.

In the insert body according to the present embodiment, as a result that the driver action portion is held in the holder of the insert body, the driver action portion can rotate without interfering with the insert body. Thus, a large rotation movement of the driver action portion can be secured, so that a large rotation movement of the latch portion interlocked with the rotation movement of the driver action portion can be secured.

(22) The insert according to the present invention comprises the guide core described in any one of the above (1) to (3) and the insert body described in any one of the above (4) to (21).

In the insert according to the present invention, an action effect of the guide core described in any one of the above (1) to (3) and an action effect of the insert body described in any one of the above (4) to (21) can be exhibited.

(23) In a preferred embodiment of the insert described in the above (22), the insert is attached to a tray for carrying an electronic component to be tested to and out of a contact portion of a test head of an electronic component testing apparatus.

A contact portion of the test head of the electronic component testing apparatus is provided with a socket to which an electronic component to be tested is attached, where the electronic component to be tested is subjected to a test.

In the insert according to the present embodiment, conveying of an electronic component to be tested to the contact portion, a test on the electronic component to be tested at the contact portion, and carrying out of the electronic component after tested from the contact portion can be performed efficiently. Also, by mounting a plurality of inserts on a tray, a plurality of electronic components can be tested at a time.

(24) An electronic component handling apparatus according to the present invention is an electronic component handling apparatus for conducting a test on an area array type electronic component by connecting external terminals of the area array type electronic component to connection terminals of a socket in a state of holding the area array type electronic component in an insert, and comprising the insert described in the above (22) or (23) as the insert.

In an electronic component handling apparatus according to the present invention, action effects of the inert described in the above (22) or (23) can be exhibited.

DESCRIPTION OF THE PREFERRED EMBODIMENTS

Below, preferred embodiments of the present invention will be explained based on the drawings.

Figure 1:
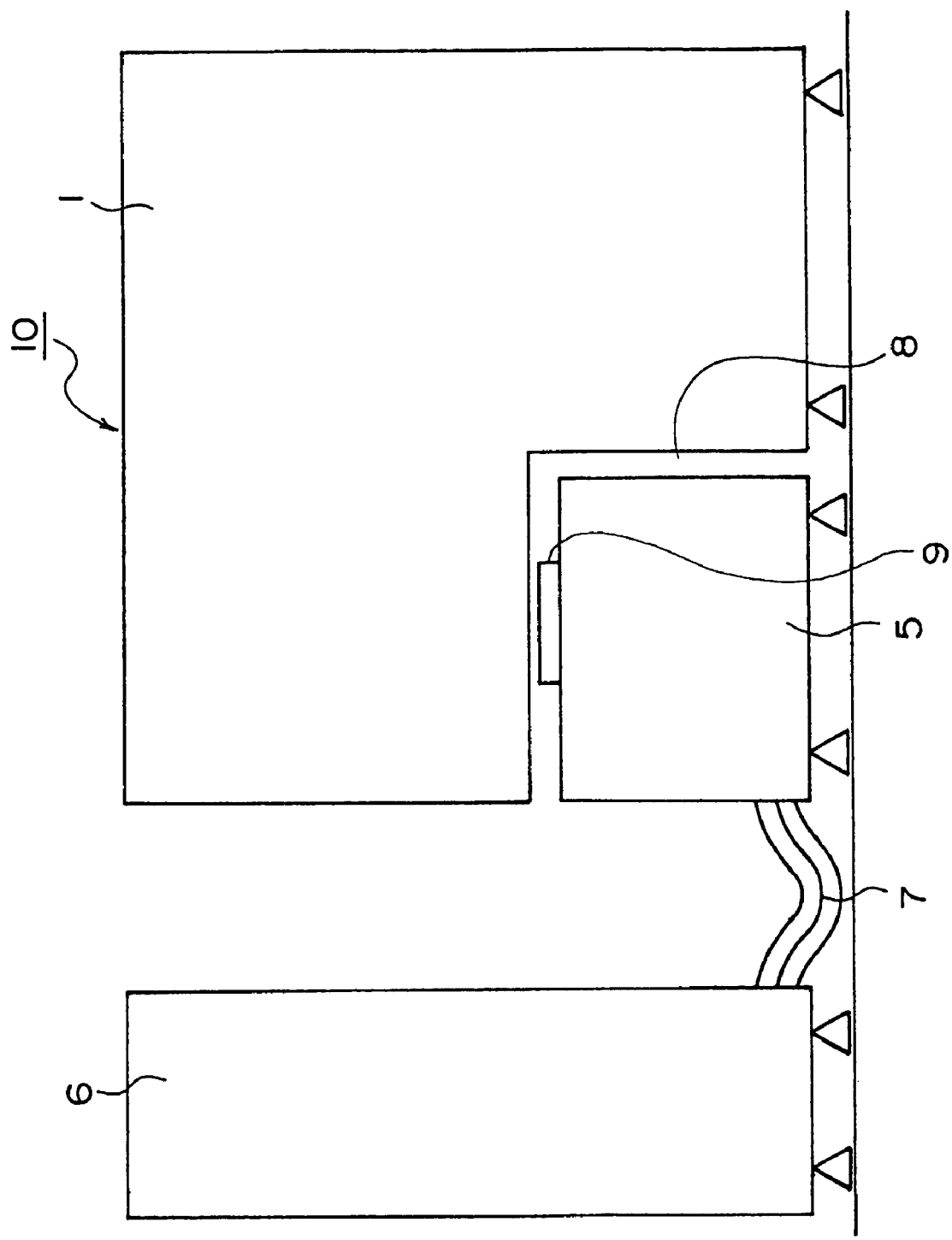
FIG. 1 is an overall view from the side of an IC testing apparatus as an embodiment of an electronic component testing apparatus according to the present invention.
Figure 2:
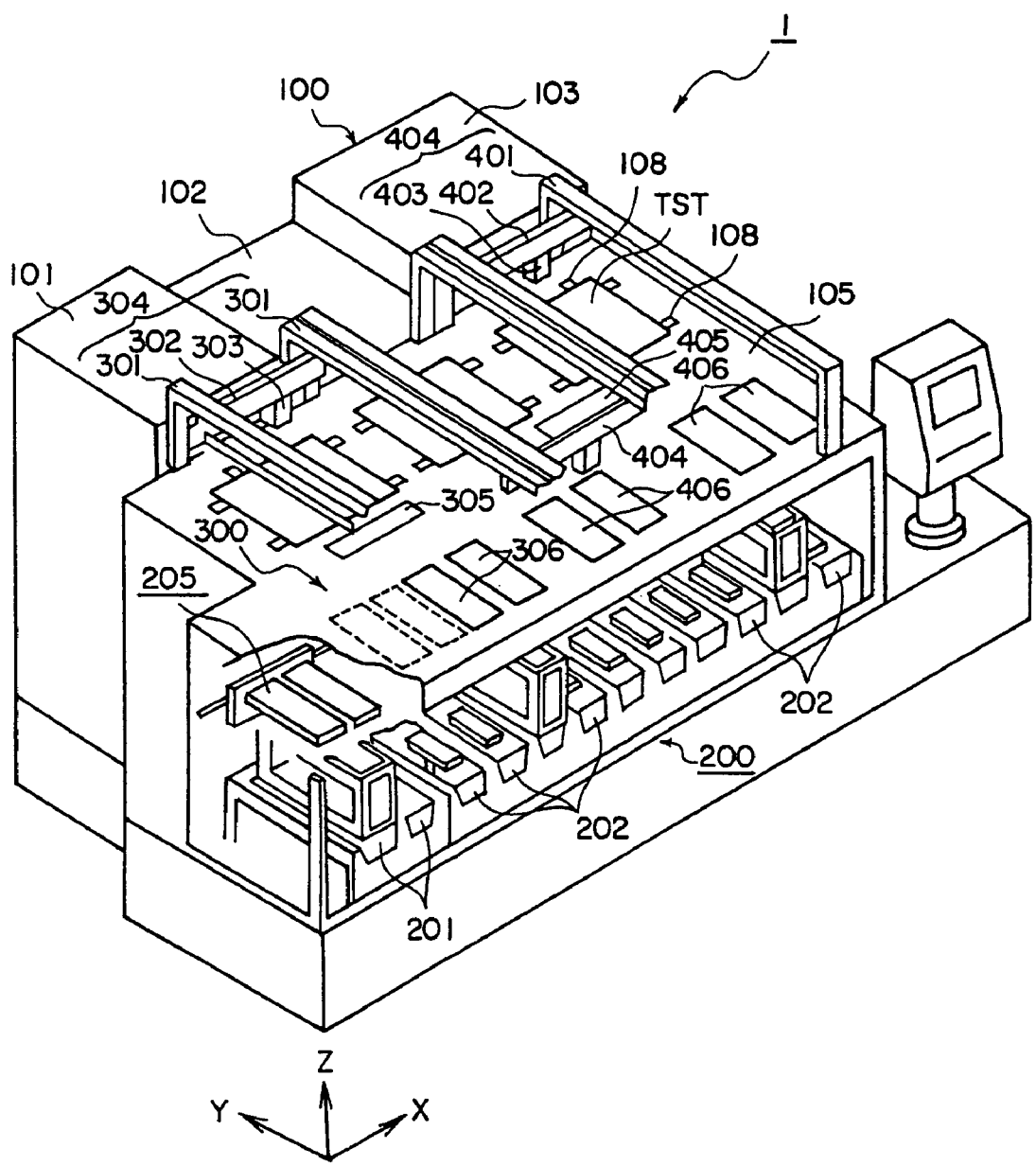
FIG. 2 is a perspective view of a handler in the IC testing apparatus.
Figure 3:
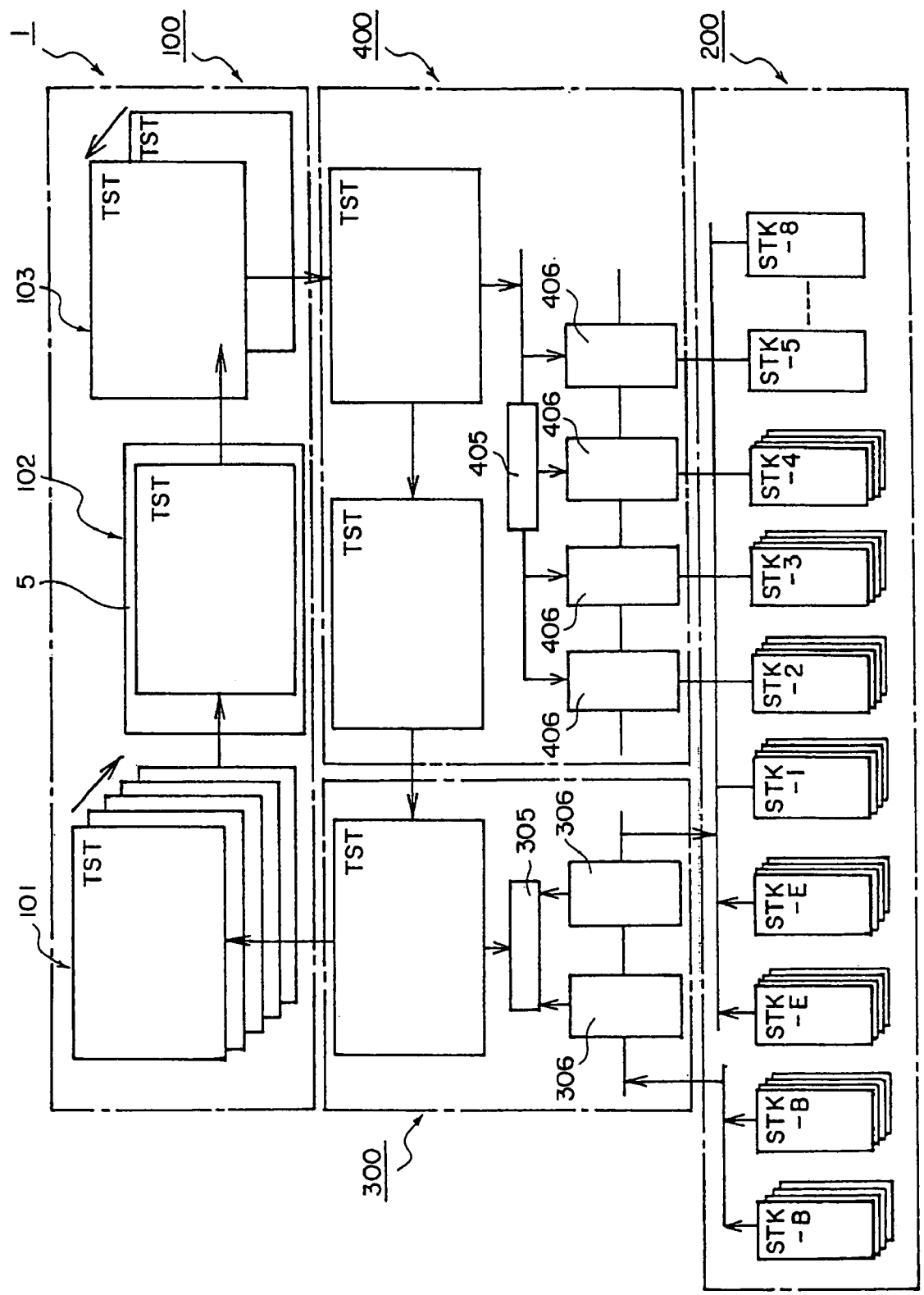
FIG. 3 is a flowchart of a tray showing a method of handling an IC to be tested.
Figure 4:
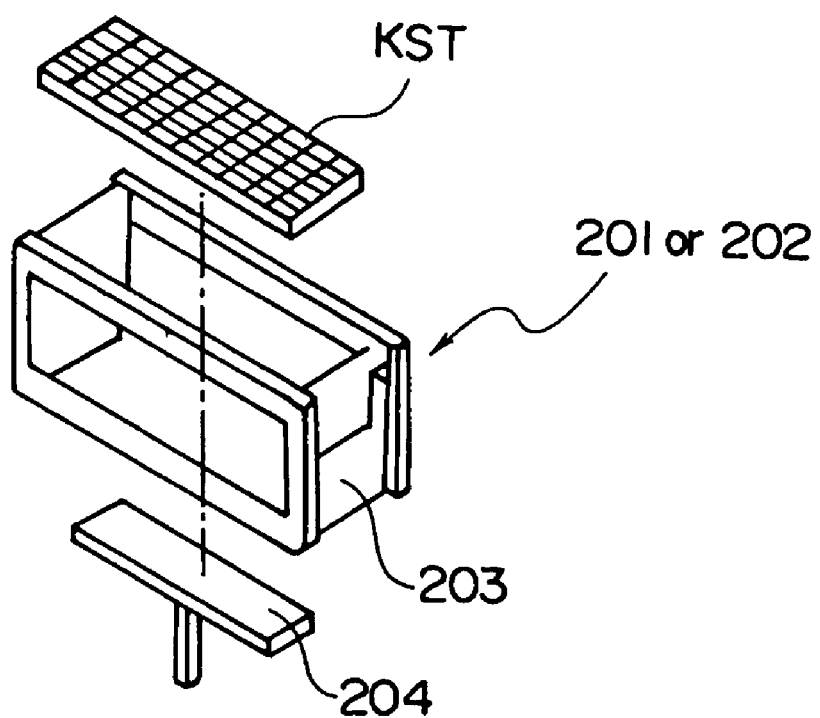
FIG. 4 is a perspective view of the configuration of an IC stocker in the IC testing apparatus.
Figure 5:
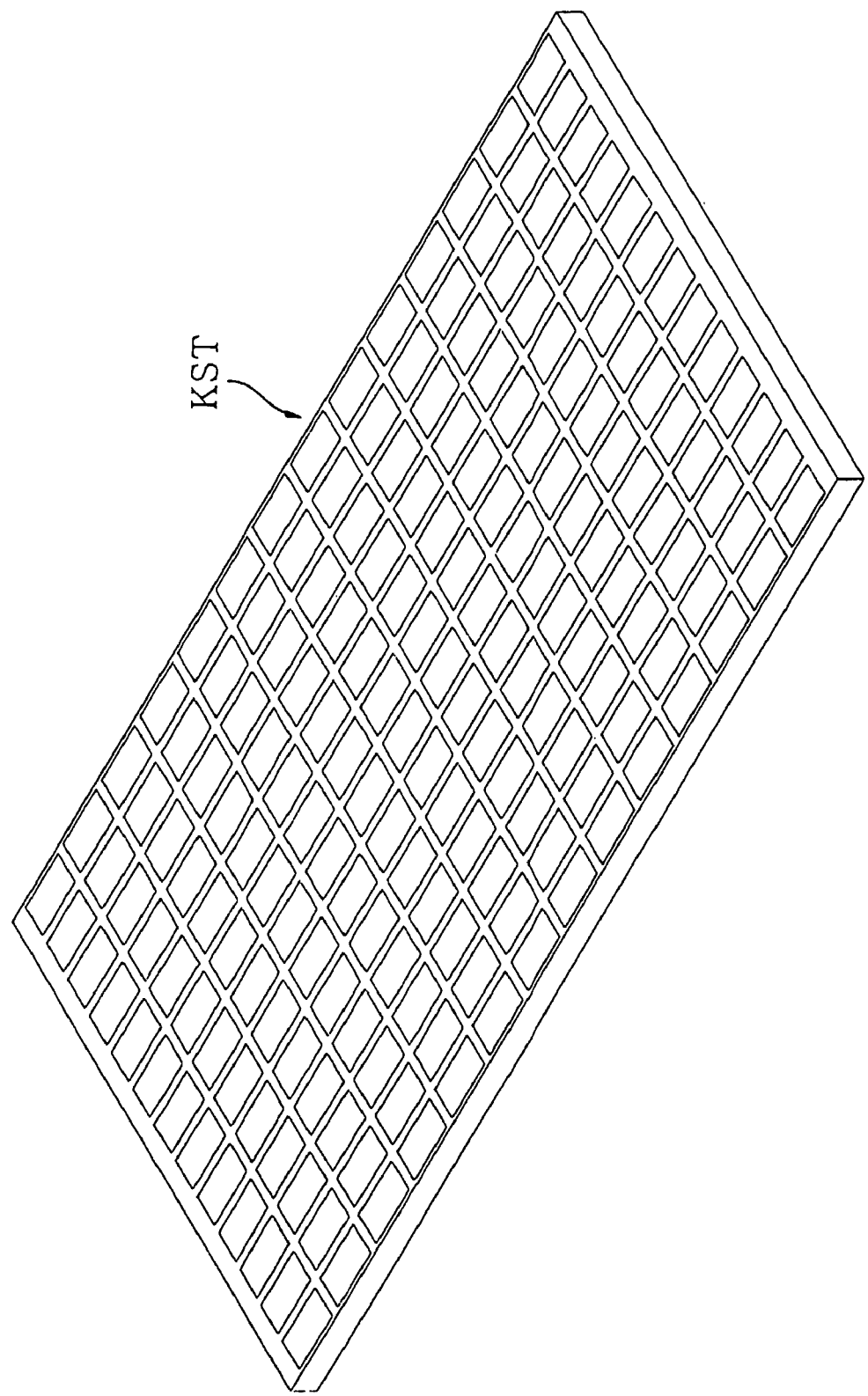
FIG. 5 is a perspective view of a customer tray used in the IC testing apparatus.
Figure 6:
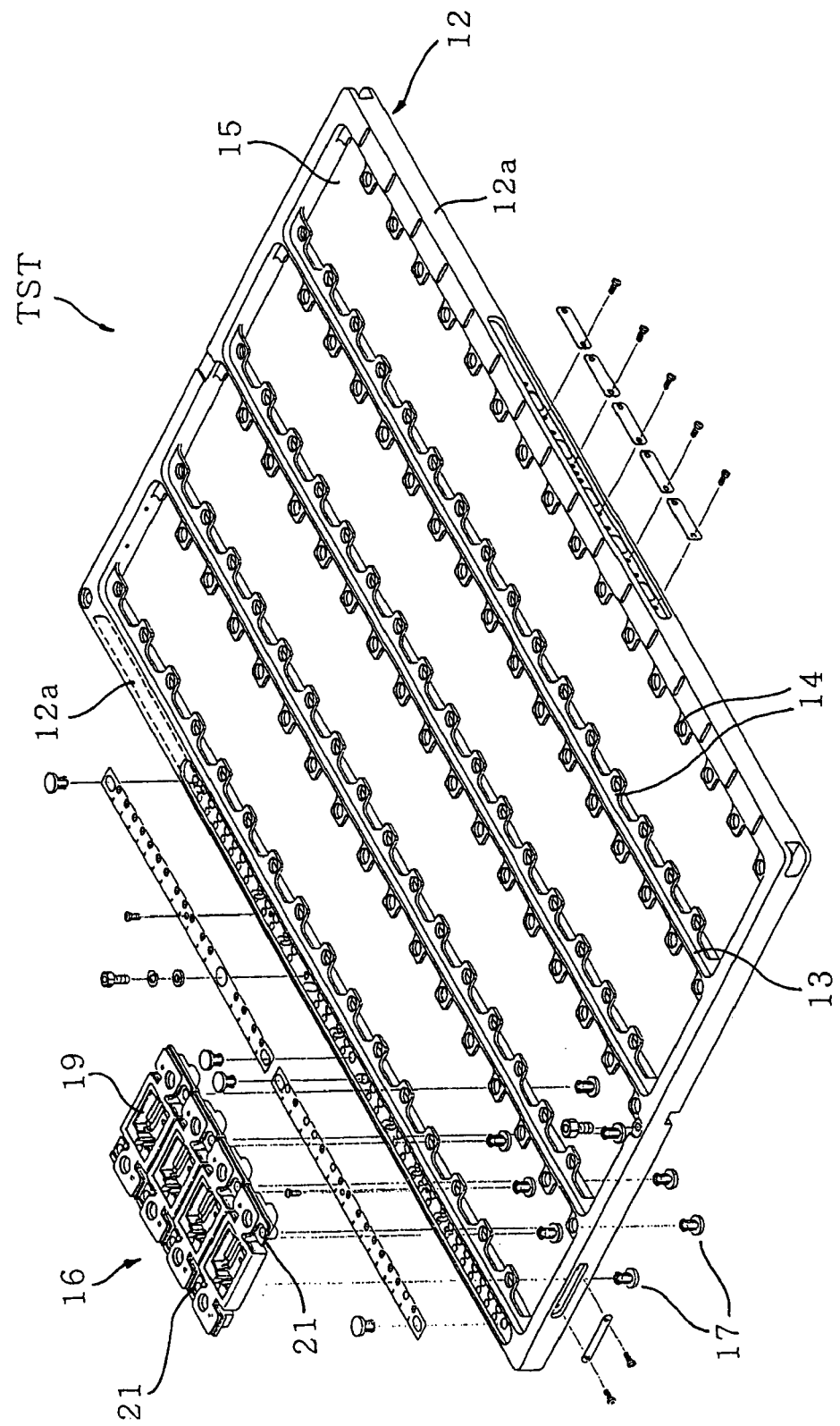
FIG. 6 is a partially disassembled perspective view of a test tray used in the IC testing apparatus.
Figure 7:
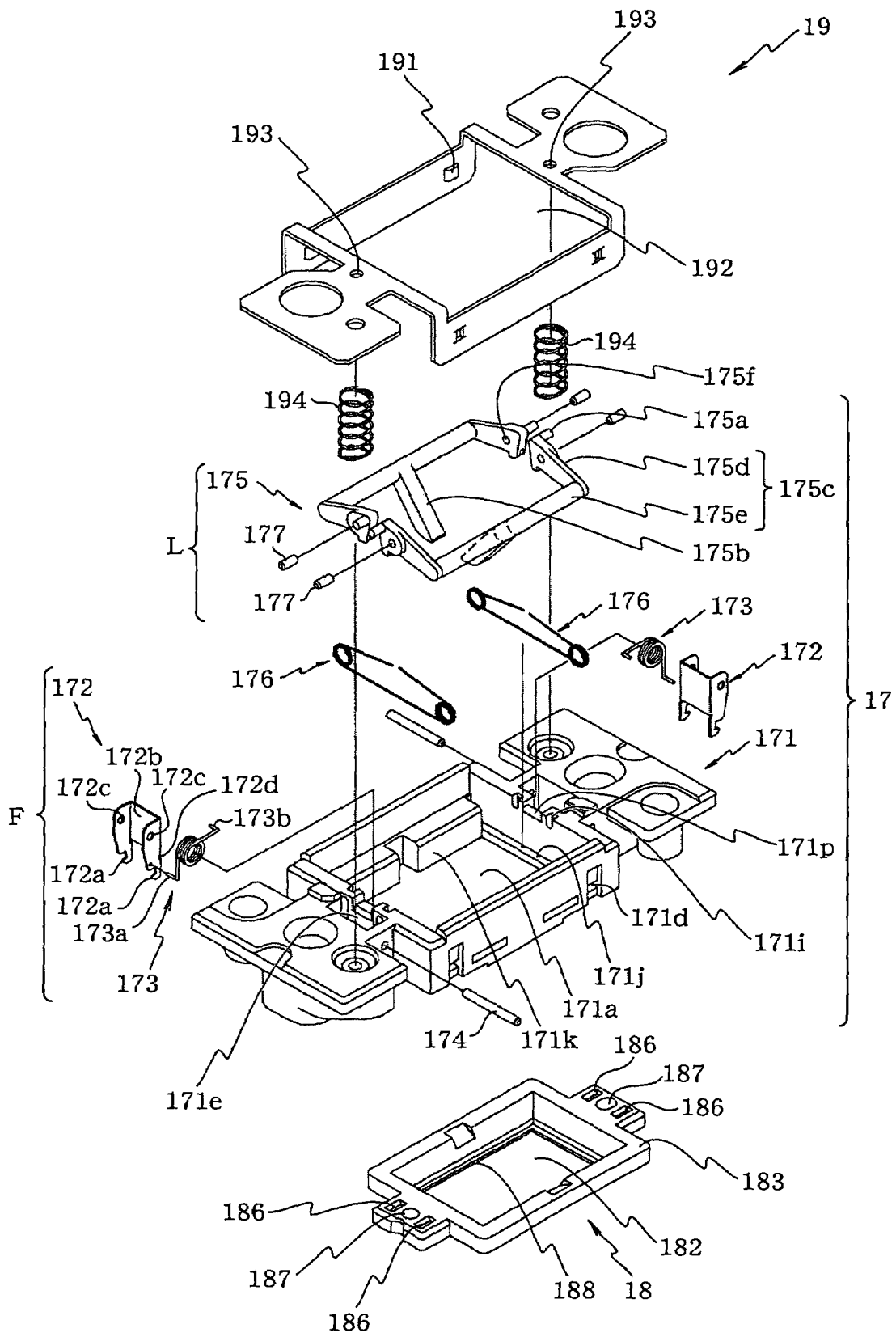
FIG. 7 is a disassembled perspective view of an insert according to the present invention used in the IC device testing apparatus.
Figure 9:
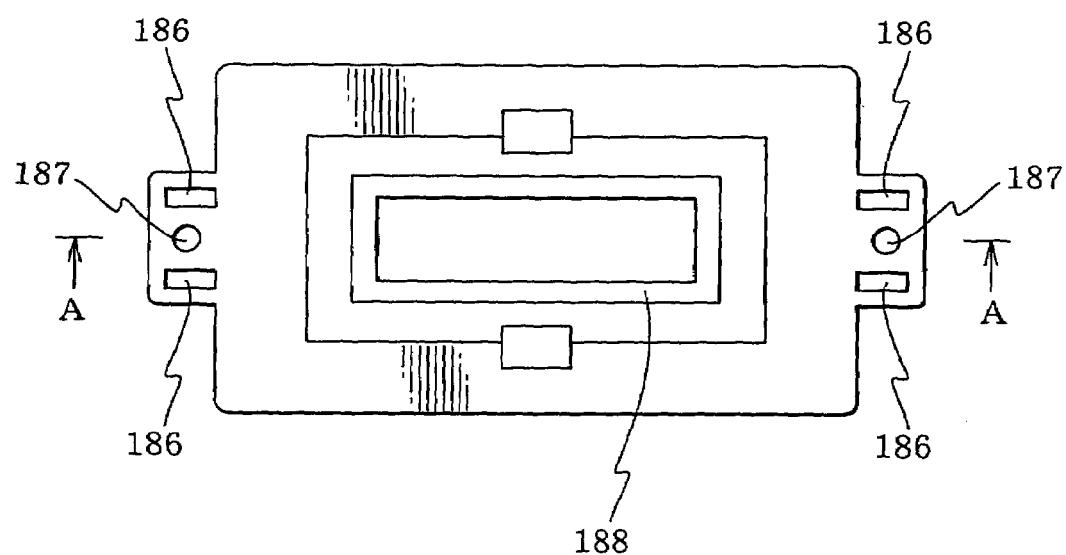
FIG. 9(a) is a view from the above of a guide core composing the insert.
FIG. 9(b) is a sectional view along the line A—A in FIG. 9(a).
Figure 9:
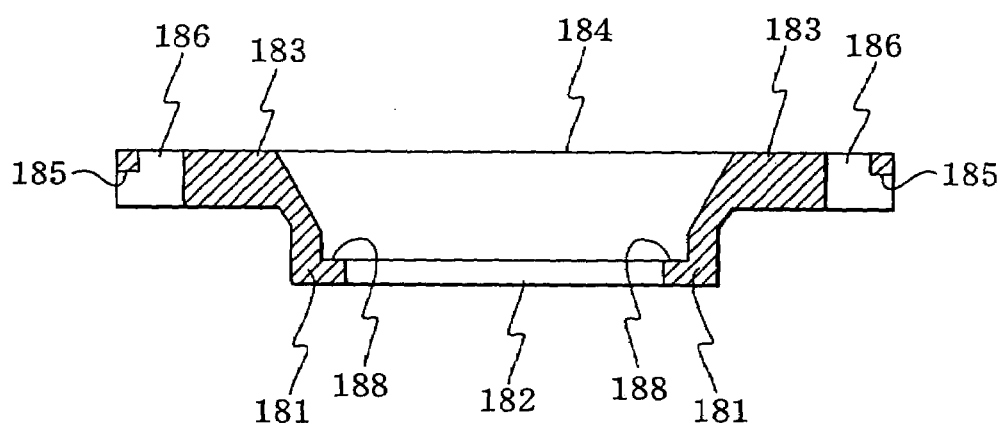
Figure 10:
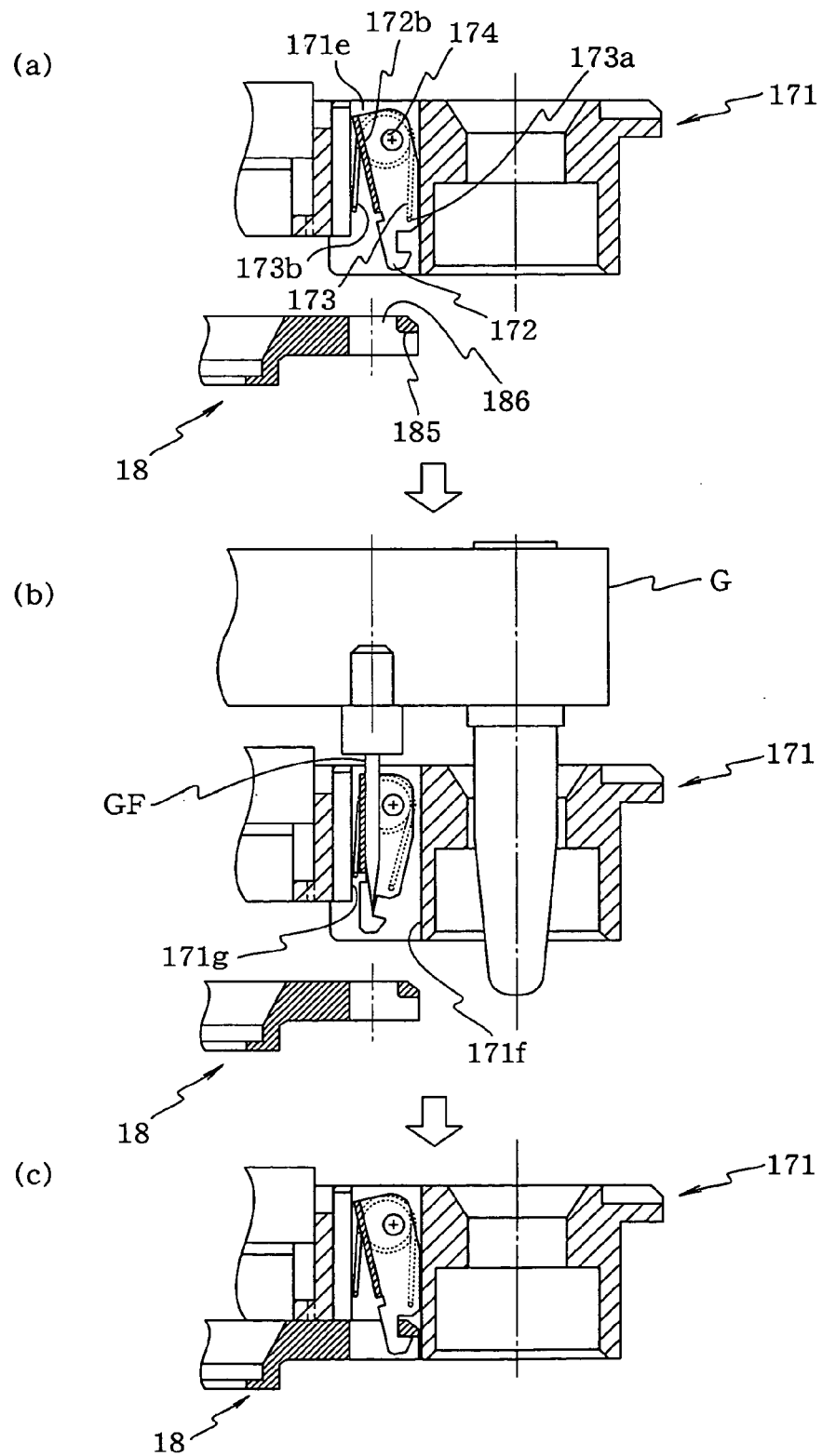
FIG. 10 is a partial sectional view for explaining a process of attaching the guide core to the insert body by a hook mechanism provided to the insert body.
Figure 12:
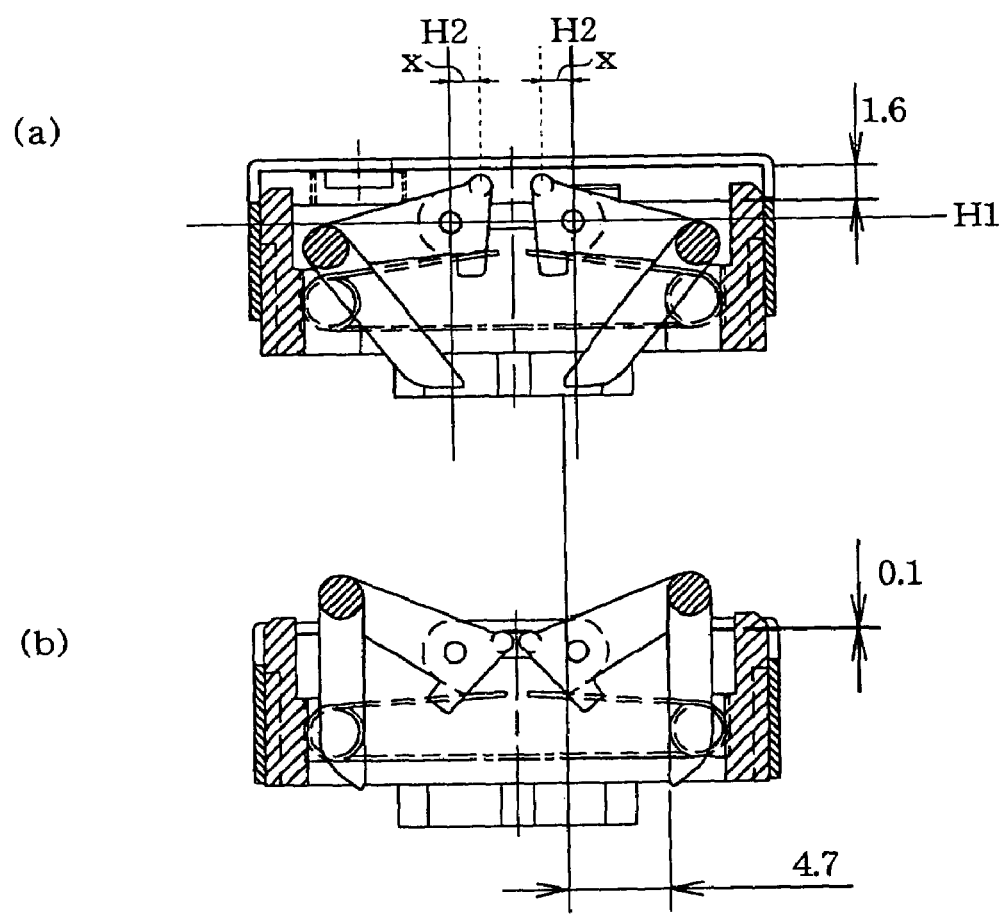
FIG. 12(a) is a sectional view of a latch mechanism provided to the insert body wherein a latch portion is at a closed position (corresponding to FIG. 11(b))
FIG. 12(b) is a sectional view of the case where the latch position is at an open position.
Figure 13:
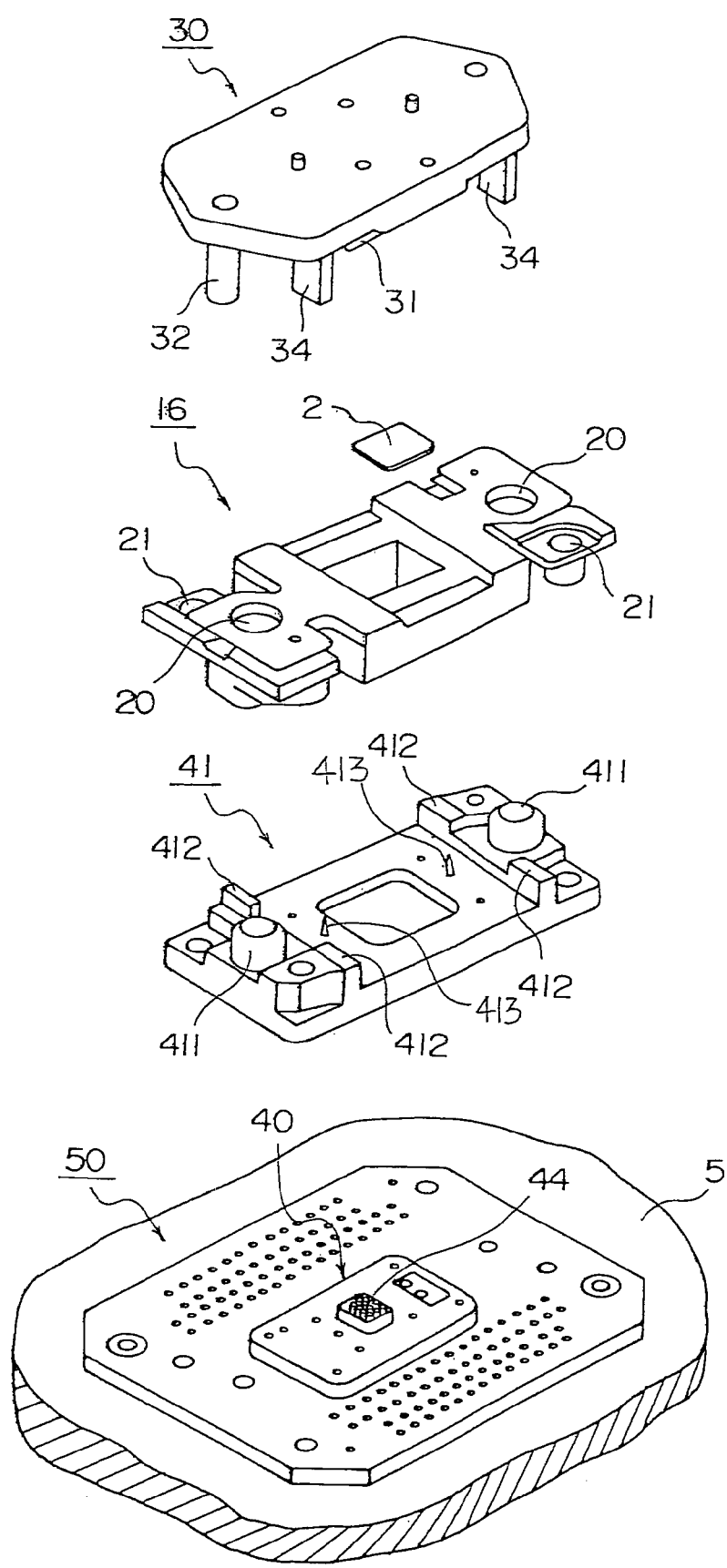
FIG. 13 is a disassembled perspective view of the configuration around a socket in a test head of the IC device testing apparatus.
Figure 14:
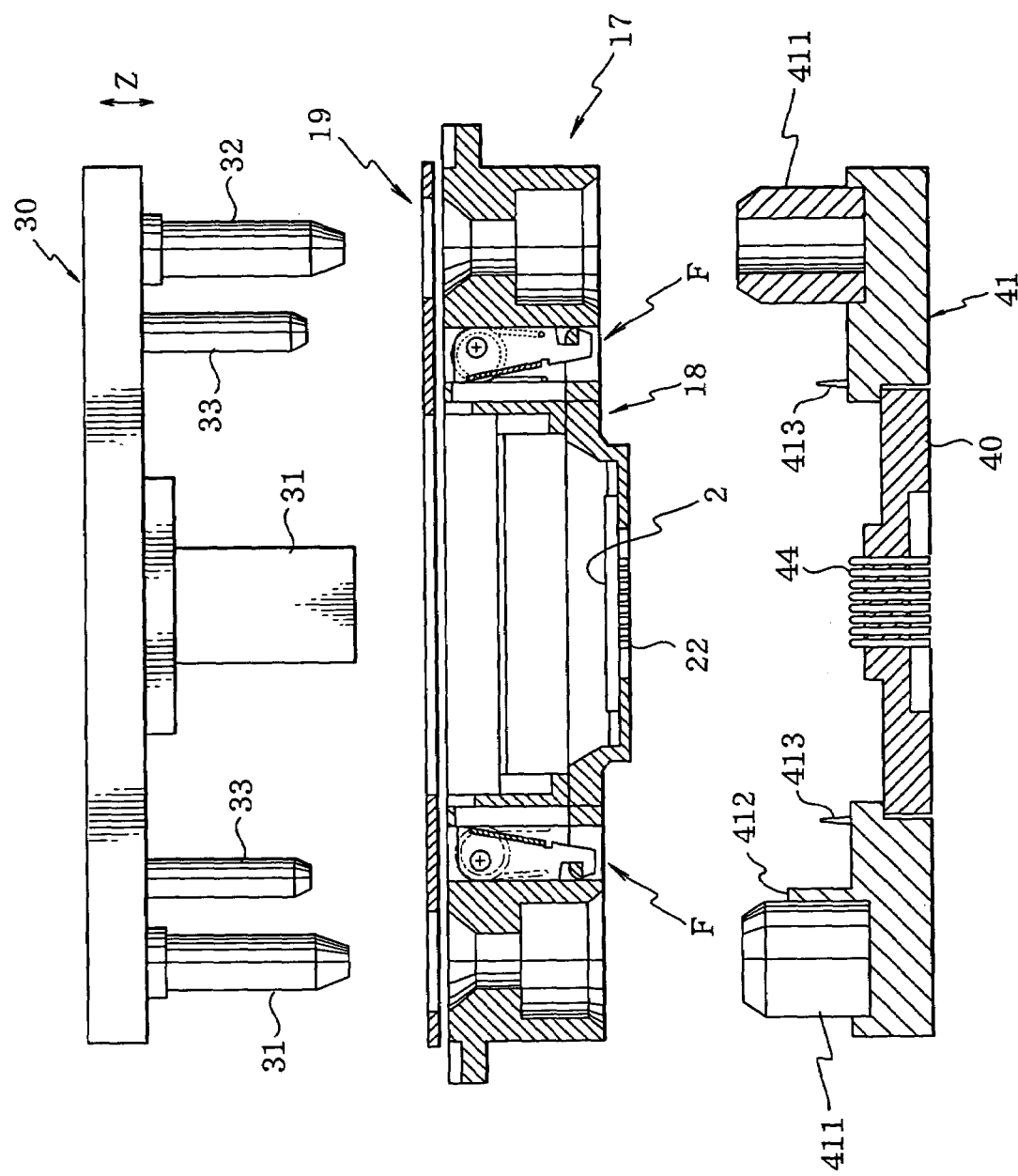
FIG. 14 is a sectional view of a part of the configuration around the socket in the test head of the IC device testing apparatus.
Figure 15:
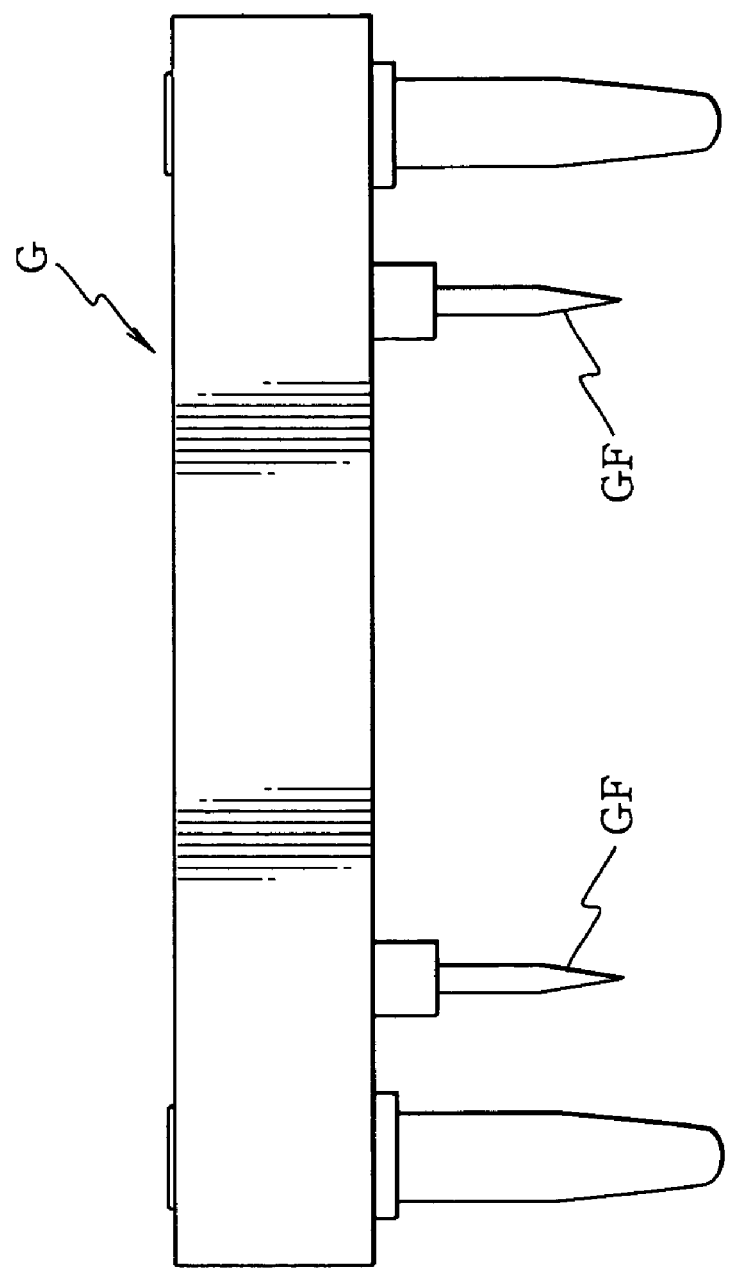
FIG. 15 is a view from the side of a jig used at the time of attaching the guide core to the insert body by a hook mechanism provided to the insert body and detaching the guide core from the insert body by the hook mechanism provided to the insert body.

FIG. 1 is an overall view from a side of an IC testing apparatus as an embodiment of an electronic component testing apparatus according to the present invention, FIG. 2 is a perspective view of a handler in the IC testing apparatus, FIG. 3 is a flowchart of a tray showing a method of handling an IC to be tested, FIG. 4 is a perspective view of the configuration of an IC stocker in the IC testing apparatus, FIG. 5 is a perspective view of a customer tray used in the IC testing apparatus, FIG. 6 is a partially disassembled perspective view of a test tray used in the IC testing apparatus, FIG. 7 is a disassembled perspective view of an insert according to the present invention used in the IC device testing apparatus, FIG. 8(a) is a view from the above of a body portion of an insert body composing the insert, FIG. 8(b) is a sectional view along the line A—A in FIG. 8(a), FIG. 9(a) is a view from the above of a guide core composing the insert, FIG. 9(b) is a sectional view along the line A—A in FIG. 9(a), FIG. 10 is a partial sectional view for explaining a process of attaching the guide core to the insert body by a hook mechanism provided to the insert body, FIG. 11(a) is a view from the above of the insert body, FIG. 11(b) is a sectional view along the line A—A in FIG. 11(a), FIG. 12(a) is a sectional view of a latch mechanism provided to the insert body wherein a latch portion is at a closed position (corresponding to FIG. 11(b)), FIG. 12(b) is a sectional view of the case where the latch position is at an open position, FIG. 13 is a disassembled perspective view of the configuration around a socket in a test head of the IC device testing apparatus, FIG. 14 is a sectional view of a part of the configuration around the socket in the test head of the IC device testing apparatus, and FIG. 15 is a view from the side of a jig used at the time of attaching the guide core to the insert body by a hook mechanism provided to the insert body and detaching the guide core from the insert body by the hook mechanism provided to the insert body.

Note that FIG. 3 is a view for understanding a method of handling IC devices to be tested in the IC device testing apparatus according to the present embodiment and partially shows by a plan view members actually arranged aligned in the vertical direction. Therefore, the mechanical (three-dimensional) structure will be explained with reference to FIG. 2.

First, an overall configuration of the IC device testing apparatus according to the present embodiment will be explained.

As shown in FIG. 1, an IC device testing apparatus 10 according to the present embodiment comprises a handler 1, a test head 5 and a main testing device 6. The handler 1 performs operations of successively conveying IC devices as electronic components to be tested to sockets of a contact portion 9 provided on top of the test head 5, sorting tested IC devices in accordance with test results and storing to predetermined trays. The IC devices to be tested by the IC device testing apparatus 10 are BGA, LGA, PGA, CSP and other area array type IC devices.

The sockets of the contact portion 9 are electrically connected to the main testing device 6 through the test head 5 and a cable 7, and the IC devices detachably mounted on the sockets are electrically connected to the main testing device 6 through the test head 5 and the cable 7. The IC devices mounted on the sockets are applied test electric signals from the main testing device 6, response signals read from the IC devices are sent to the main testing device 6 through the cable 7, and thereby, performance and functions, etc. of the IC devices are tested.

At a lower portion of the handler 1, a control apparatus for mainly controlling the handler 1 is built in and a space portion 8 is provided at a part thereof. The test head 5 is arranged in this space portion 8 in a freely exchangeable way, and IC devices can be attached to and detached from the sockets of the contact portion 9 provided on top of the test head 5 through holes formed on the handler 1.

The IC device testing apparatus 10 is an apparatus for testing IC devices as electronic components to be tested in a higher temperature state (at a high temperature) and a lower temperature state (at a low temperature) than a normal temperature, and the handler 1 has a chamber 100 composed of a constant temperature chamber 101, a test chamber 102 and an unsoak chamber 103 as shown in FIG. 2 and FIG. 3. The contact portion 9 provided on top of the test head 5 shown in FIG. 1 is inserted to inside the test chamber 102, where a test of the IC devices is conducted.

As shown in FIG. 2 and FIG. 3, the handler 1 in the IC device testing apparatus 10 comprises an IC magazine 200 for holding pre-test IC devices and classifying and holding post-test IC devices, a loader section 300 for transferring IC devices to be tested sent from the IC magazine 200 to the chamber 100, a chamber 100 including the test head 5 and an unloader section 400 for classifying and taking out IC devices tested in the chamber 100. Note that the IC devices are held on the test tray while being conveyed in the handler 1.

A large number of the IC devices are held on the customer tray KST shown in FIG. 5 before being held in the handler 1, supplied in that state to the IC magazine 200 of the handler 1 shown in FIG. 2 and FIG. 3, where the IC devices are reloaded from the customer tray KST to the test tray TST (refer to FIG. 6) to be conveyed in the handler 1. Inside the handler 1, as shown in FIG. 3, the IC devices are moved in a state of being loaded on the test tray TST, given a thermal stress of a high temperature or a low temperature for testing (inspecting) whether or not they operate appropriately and sorted in accordance with the test result. Below, inside of the handler 1 will be explained individually in detail.

First, a part relating to the IC magazine 200 will be explained.

As shown in FIG. 2, the IC magazine 200 is provided with a pre-test IC stocker 201 for holding IC devices before tested and a post-test IC stocker 202 for holding IC devices classified in accordance with the test results.

These pre-test IC stocker 201 and post-test IC stocker 202 comprise, as shown in FIG. 4, a frame-shaped tray support frame 203 and an elevator 204 able to enter from under the tray support frame 203 and move toward the top. The tray support frame 203 supports in it a plurality of stacked customer trays KST, and only the stacked customer trays KST are moved up and down by the elevator 204.

The pre-test IC stocker 201 shown in FIG. 2 holds stacked customer trays KST on which the IC devices to be tested are held, while the post-test IC stocker 202 holds stacked customer trays KST on which IC devices finished being tested are classified.

Note that since the pre-test IC stocker 201 and the post-test IC stocker 202 are structured the same or substantially the same, a pre-test IC stocker 201 can be used as a post-test IC stocker 202, and the opposite case is also possible. Accordingly, the number of the pre-test stocker 201 and the number of the post-test IC stocker 202 can be easily changed in accordance with need.

As shown in FIG. 2 and FIG. 3, in the present embodiment, two stockers SKT-B are provided as the pre-test IC stocker 201 and provided next to that with two empty stockers STK-E as the post-test IC stocker 202 to be sent to the unloader section 400. Furthermore, next to that, eight stockers SKT-1, SKT-2, . . . , SKT-8 are provided as the post-test stocker 202 and configured to be able to hold IC devices sorted into a maximum of eight classes according to the test results. That is, in addition to classifying IC devices as good and defective, it is possible to divide the good IC devices into ones with high operating speeds, ones with medium speeds, and ones with low speeds and the defective IC devices into ones requiring retesting, etc.

Secondary, a part relating to the loader section 300 will be explained.

The customer tray KST held in the tray support frame 203 of the pre-test IC stocker 201 shown in FIG. 4 is conveyed by a tray transfer arm 205 provided between the IC magazine 200 and an apparatus substrate 105 from below the apparatus substrate 105 to an opening 306 of the loader section 300 as shown in FIG. 2. Then, in the loader section 300, IC devices loaded on the customer tray KST are once transferred to a preciser 305 by an X-Y conveyor 304 to correct mutual positions of the IC devices to be tested, then, the IC devices transferred to the preciser 305 are again loaded on the test tray TST stopped in the loader section 300 by using the X-Y conveyor 304.

The X-Y conveyor 304 for reloading IC devices to be tested from a customer tray KST to a test tray TST comprises, as shown in FIG. 2, two rails 301 laid over an apparatus substrate 105, a movable arm 302 able to move back and forth (this direction designated as the Y-direction) between the test tray TST and the customer tray KST by those two rails 301, and a movable head 303 supported by the movable arm 302 and able to move in the X-direction along the movable arm 302.

The movable head 303 of the X-Y conveyor 304 has suction heads attached facing downward. The suction heads move while drawing air to pick up the IC devices to be tested from the customer tray KST and reload the IC devices to be tested on the test tray TST. For example, about eight suction heads are provided for the movable head 303, so it is possible to reload eight IC devices to be tested at a time on the test tray TST.

Thirdly, a part relating to the chamber 100 will be explained.

The above explained test tray TST is loaded with IC devices to be tested at the loader section 300, then sent to the chamber 100, where the respective IC devices are tested in the state of being loaded on the test tray TST.

As shown in FIG. 2 and FIG. 3, the chamber 100 comprises a constant chamber 101 for giving a thermal stress of an objected high temperature or a low temperature to the IC devices to be tested loaded on the test tray TST, a test chamber 102 wherein the IC devices in a state of being given a thermal stress in the constant chamber 101 are mounted on sockets on the test head 5, and an unsoak chamber 103 for removing the given thermal stress from the IC devices tested in the test chamber 102.

In the unsoak chamber 103, the IC devices are brought back to the room temperature by ventilation when a high temperature was applied in the constant chamber 101, and brought back to a temperature of a degree of not causing condensation by heating by a hot air or a heater, etc. when a low temperature was applied in the constant chamber 101. Then, the IC devices brought to a normal temperature are taken out to the unloader section 400.

As shown in FIG. 2, the constant chamber 101 and the unsoak chamber 103 of the chamber 100 are arranged so as to project upward from the test chamber 102. Also, the constant chamber 101 is provided with a vertical conveyor as shown conceptually in FIG. 3, and a plurality of test trays TST are held by the vertical conveyor to wait until the test chamber 102 becomes available. The IC devices to be tested are applied a thermal stress of a high temperature or a low temperature mainly while waiting here.

A test head 5 is arranged at a lower center portion in the test chamber 102 and the test tray TST is transferred to be on the test head 5, where all IC devices 2 held by the test tray TST shown in FIG. 6 are successively brought to electrically contact with the test head 5, and all IC devices 2 on the test tray TST are tested. On the other hand, the test tray TST finished the test is removed a thermal stress in the unsoak chamber 103 so as to bring the temperature of the IC devices 2 to the room temperature, then, taken out to the unloader section 400 shown in FIG. 2 and FIG. 3.

Also, as shown in FIG. 2, at an upper portion of the constant chamber 101 and the unsoak chamber 103 is formed an inlet opening for taking in the test tray TST from the apparatus substrate 105 and an outlet opening for taking out the test tray TST to the apparatus substrate 105, respectively. The apparatus substrate 105 is attached test tray conveyors 108 for taking in and out the test tray TST to and from the openings. The conveyor 108 comprises, for example, a rotation roller, etc. The test tray TST taken out from the unsoak chamber 103 is sent back to the constant chamber 101 via the unloader section 400 and the loader section 300 by the test tray conveyor 108 provided on the apparatus substrate 105.

The test tray TST has a rectangular frame 12 as shown in FIG. 6, and the frame 12 is provided with a plurality of bars 13 in parallel at regular intervals. On both sides of the bars 13 and inside the sides 12a of the frame 12 in parallel with the bars 13 are formed a plurality of mounting tabs 14 protruding in the longitudinal direction at regular intervals. Each of insert magazines 15 is composed of two mounting tabs 14 facing to each other among the plurality of mounting tabs 14 provided between the bars 13 and between the bars and the sides 12*a*.

The each of the insert magazines 15 is to hold one insert 16. A mounting hole 21 for the mounting tab 14 is formed at both ends of the insert 16, and the insert 16 is attached to the two mounting tabs 14 in a floating state (a slightly movable state in three dimensionally) by using a fastener. The inserts 16 are, for example, provided to one test tray TST by the number of 4×16 or so and IC devices to be tested are loaded on the test tray TST as a result that the IC devices to be tested are held in the inserts 16.

In the case where IC devices to be tested are arranged by 4 lines×16 rows as shown in FIG. 6, IC devices to be tested, for example, arranged in every three rows in respective lines are tested at a time. Namely, in the first test, 16 IC devices to be tested arranged on the first, fifth, ninth and twelfth rows in respective lines are tested at a time, and in the second test, the test tray TST is moved for an amount of one row and IC devices arranged on the second, sixth, tenth and fifteenth rows are tested at a time. By repeating this, all IC devices to be tested are tested (which is called measuring 16 at a time). A result of the test is stored at an address determined, for example, by an identification number assigned to the test tray TST and a number of ID devices to be tested assigned inside the test tray TST.

Figure 18:
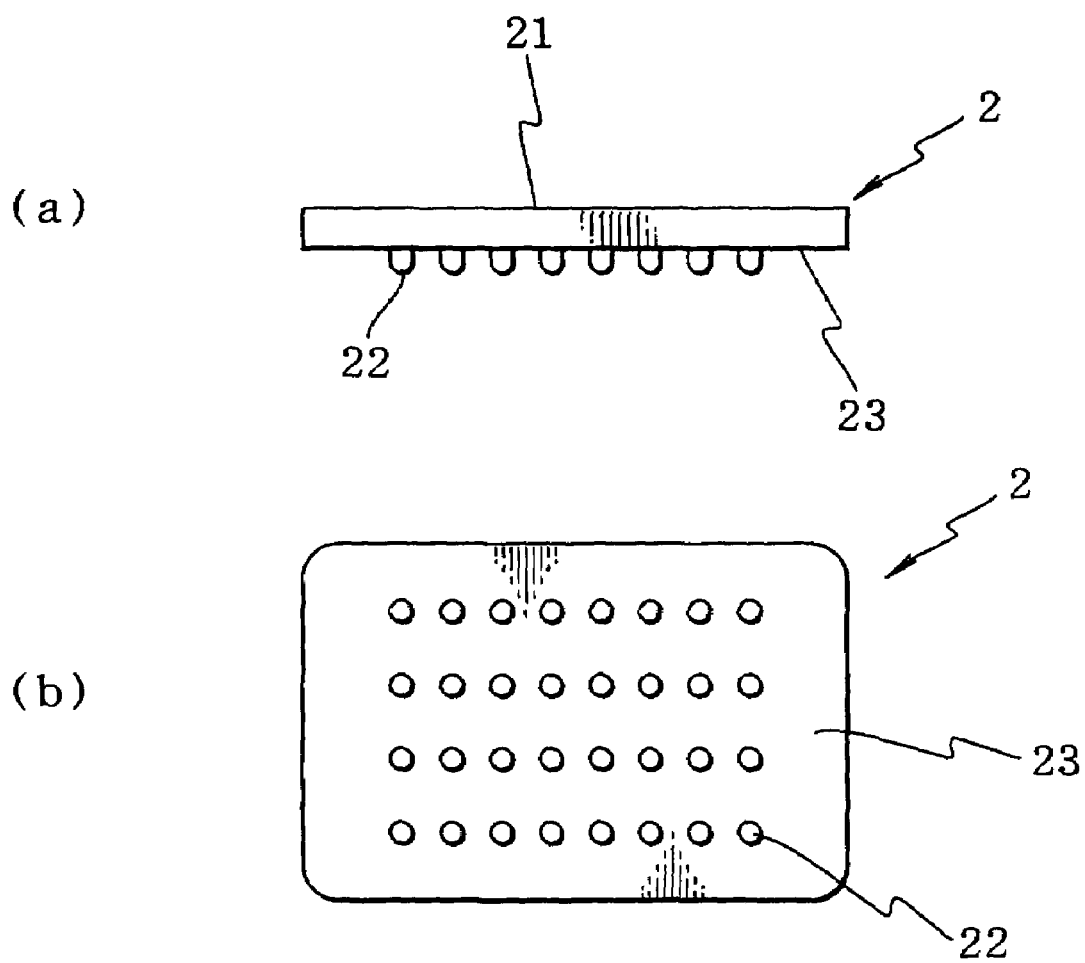
FIG. 18(a) is a view from the side of an IC device as a test object of the IC testing apparatus.
FIG. 18(b) is a view from below of the IC device.
Figure 19:
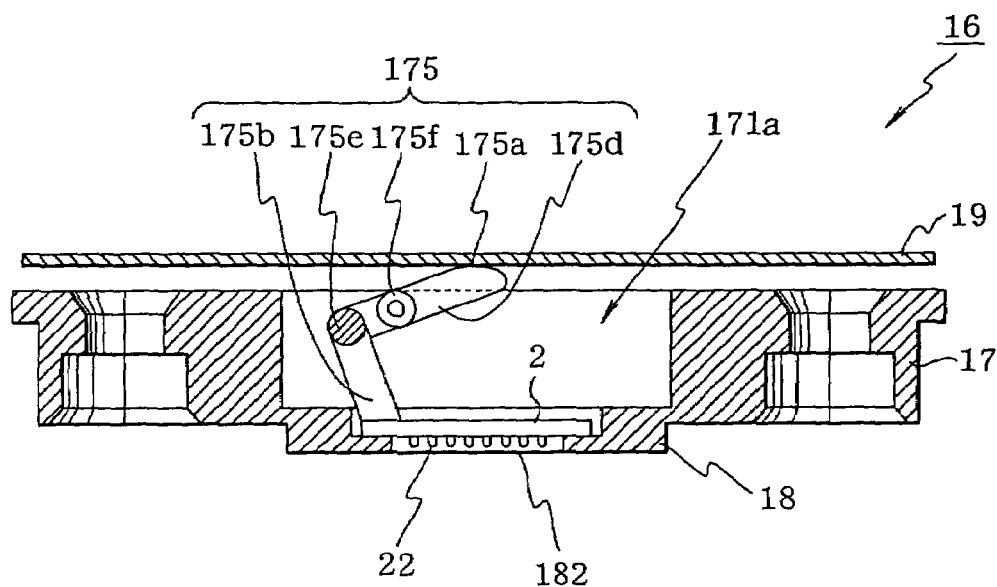
FIG. 19(a) is a partial sectional view of a conventional insert wherein a latch mechanism is in an open state.
FIG. 19(b) is a partial sectional view of the case where the latch mechanism is in a closed state.
Figure 19:
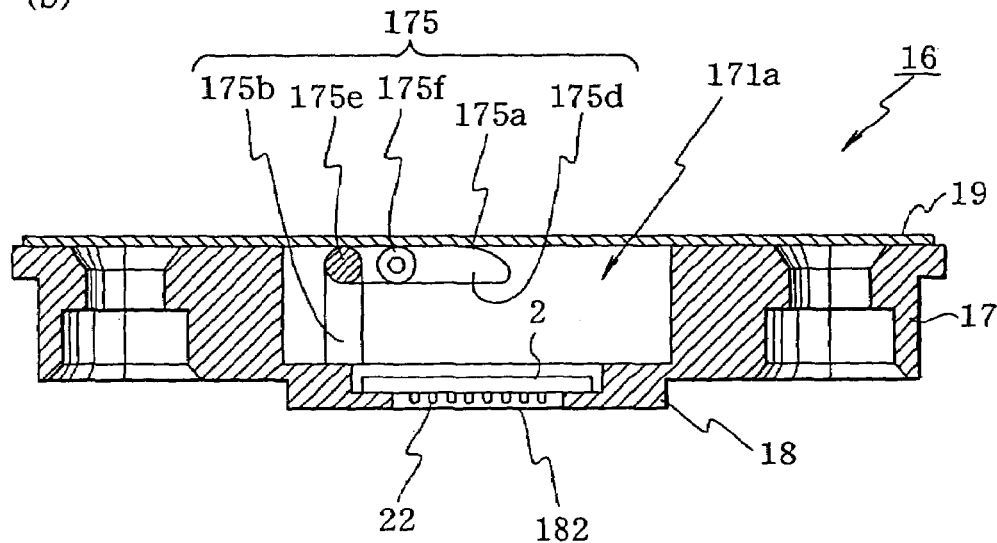

An example of IC devices to be tested held in the insert 16 is shown in FIG. 18. FIG. 18(*a*) is a view from the side of the IC device to be tested and FIG. 18(*b*) is a view from the bottom of the IC device to be tested. As shown in FIG. 18, the IC device to be tested 2 is a BGA type IC device having soldering balls as external terminals 22 arranged in matrix on a lower surface 23 of the package body 21. The lower surface 23 of the package body 21 arranged with the external terminals 22 corresponds to an external terminal face of the IC device 2.

The insert 16 according to the present embodiment comprises an insert body 17, a core guide 18 and a lever plate 19 as shown in FIG. 7.

Figure 8:
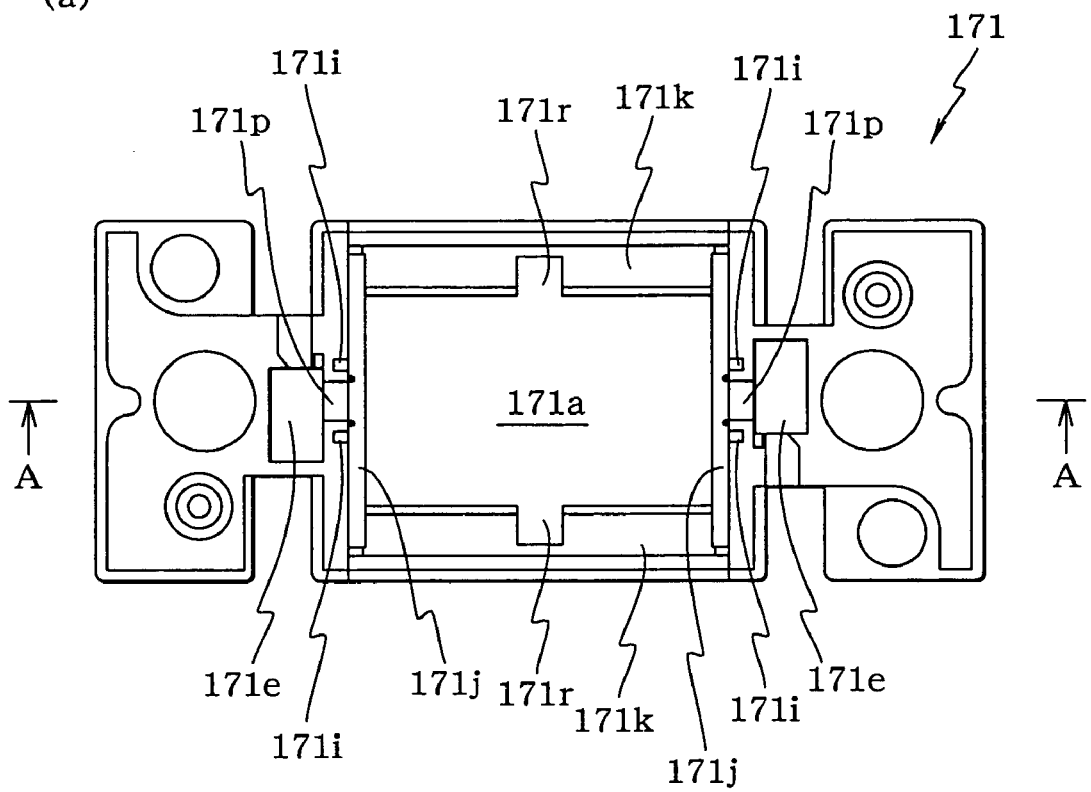
FIG. 8(a) is a view from the above of a body portion of an insert body composing the insert.
FIG. 8(b) is a sectional view along the line A—A in FIG. 8(a).
Figure 8:
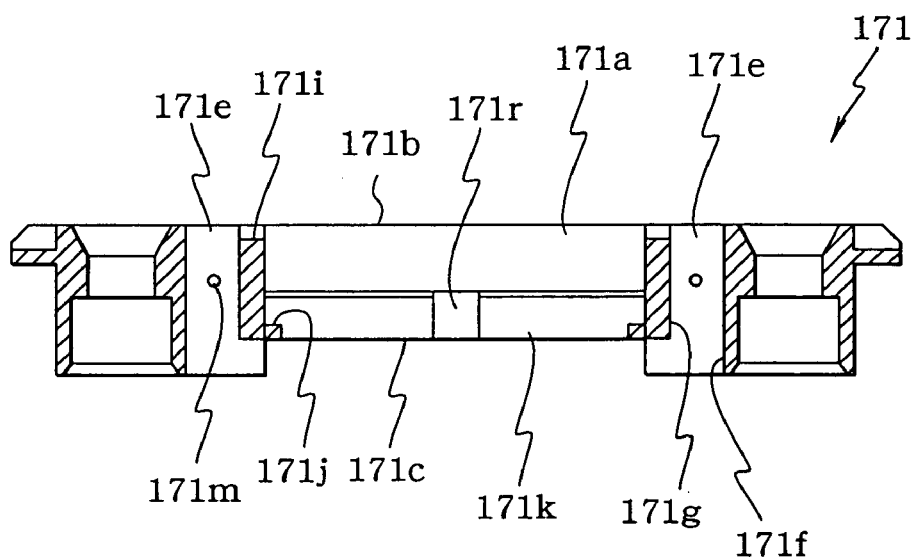

The insert body 17 comprises a body portion 171, a hook mechanism F and a latch mechanism L as shown in FIG. 7. At the approximate center of the body portion 171 of the insert body 17 is provided with a device guide portion 171*a* opened in the vertical direction as shown in FIG. 7 and FIG. 8. The device guide portion 171*a* has a device inlet 171*b* at an upper end and a guide core attachment socket 171*c* at a lower end as shown in FIG. 8. The device inlet 171*b* and the guide core attachment socket 171*c* are connected, so that an IC device entered from the device inlet 171*b* can be guided to the guide core 18 attached to the guide core attachment socket 171*c*. Consequently, IC devices to be tested conveyed by the X-Y conveyor 304 from a customer tray KST to a test tray TST are guided by the device guide portion 171*a* and carried to the guide core 18 attached to the guide core attachment socket 171*c*. Also, after testing the IC devices, the IC devices after tested are guided by the device guide portion 171*a* to be carried out from the device inlet 171*b*.

On top of the body portion 171 of the insert body 17 is attached a lever plate 19 via a pressure spring 194 as shown in FIG. 7. The lever plate 19 is biased upward (in the direction that the lever plate 19 moves away from the body portion 171 of the insert body 17) by the pressure spring 194, moves downward when receiving a downward pressure force (in the direction that the lever plate 19 moves close to the body portion 171 of the insert body 17), and moves upward due to the biasing force of the pressure spring 194 when the pressure force is released. At the time that the lever plate 19 moves upward, the upward move amount of the lever plate 19 is regulated as a result that protrusions 191 formed on the lever plate 19 engages with a concave portions 171*d* formed on the body portion 171 of the insert body 17.

At the approximate center of the lever plate 19 is provided with an opening 192 as shown in FIG. 7 so that the device inlet 171*b* of the body portion 171 of the insert body 17 is exposed. The opening 192 of the lever plate 19 is formed a little larger than the device inlet 171*b* so that carrying in and out of an IC device through the device inlet 171*b* is not hindered nor rotation of a later explained latch 175 is not hindered. Also, the lever plate 19 is formed through holes 193 connected to core clamp holders 171*e* provided to the body portion 171 of the insert body 17 as shown in FIG. 7, so that shafts GF of a jig G shown in FIG. 15 can enter the core clamp holders 171*e* through the through holes 193 of the lever plate 19.

On the lower side of the body portion 171 of the insert 17 is attached the guide core 18 as shown in FIG. 7. The core guide 18 comprises, as shown in FIG. 7 and FIG. 9, a device supporting portion 181 composed of a bottom plate portion and a side plate portion formed upright on the bottom plate portion and a flange portion 183 provided at an upper end rim of the side plate portion of the device supporting portion 181. At the approximate center of the bottom plate portion of the device supporting portion 181 is provided an opening 182 as shown in FIG. 7 and FIG. 9, and the bottom plate portion of the device supporting portion 181 can support an external terminal face of an IC device by the rim 188 of the opening portion 182. The external terminals of the IC device supported by the device supporting portion 181 are exposed to the direction of connection terminals of a socket through the opening portion 182.

At the upper end of the guide core 18 is provided with a device guide connection hole 184 connected to the opening portion 182 as shown in FIG. 7 and FIG. 9, and when the guide core 18 is attached to the guide core attachment socket 171*c* of the insert body 17, the opening portion 182 of the guide core 18 is connected to the device guide portion 171*a* of the insert body 17 through the device guide portion connection hole 184. As a result, the IC device can be guided from the device guide portion 171*a* of the insert body 17 to the device supporting portion 181 of the guide core 18. On an inner surface of the flange 183 is tapered as shown in FIG. 7 and FIG. 9, so that the IC device can be surely guided to the device supporting portion 181.

As shown in FIG. 7 and FIG. 9, the flange portion 183 is provided with two hook insertion holes 186 respectively at opposing positions (on the right and the left in FIG. 9). The hook insertion hole 186 is provided with a hook receiver 185 so as to be connected to the inner surface of the hook insertion hole 186 as shown in FIG. 9, and the hook portion 172*a* of the insert body 17 can be engaged with the hook receiver 185 in a state of being inserted in the hook insertion hole 186 and when the engagement with the hook receiver 185 is released, the hook portion 172*a* can recede from the hook insertion hole 186. Also, as shown in FIG. 7 and FIG. 9, the flange portion 183 is provided with guide shaft fitting holes 187 for fitting therein guide shafts 413 of the socket guide 41 (refer to FIG. 13 and FIG. 14). By fitting the guide shafts 413 in the guide shaft fitting holes 187, the guide core 18 can be accurately aligned with the socket 40.

As shown in FIG. 7, the body portion 171 of the insert body 17 is provided with hook mechanisms F, each comprising a core clamp 172, a torsion spring 173 and a shaft 174. The core clamp 172 comprises, as shown in FIG. 7, two hook portions 172a facing toward an identical direction and a flat plate shaped jig receiver 172b connecting between the two hook portions 172a. The core clamp 172 is formed a through hole 172c at an upper portion of each of the two hook portions 172a as shown in FIG. 7. As a result that the shaft 174 is inserted to through holes 171m of the body portion 171 of the insert body 17 (refer to FIG. 8) and to the through holes 172c of the core clamp 172, the core clamp 172 is rotatably supported by the body portion 171 of the insert body 17.

Since the shaft 174 is provided to the body portion 171 of the insert body 17 so as to be substantially perpendicular with the direction that the hook portion 172a engages with the hook receiver 185, the hook portion 172a can rotate in the direction for engaging with the hook receiver 185 and the direction for releasing the engagement with the hook receiver 185. Also, the position that the shaft 174 is provided is adjusted so that the hook portion 172a positions lower than the guide core attachment socket 171c (refer to FIG. 10) and the hook portion 172a can enter the hook insertion hole 186 of the guide core 18 attached to the guide core attachment socket 171c.

In the body portion 171 of the insert body 17, as shown in FIG. 7 and FIG. 8, core clamp holders 171e opened in the vertical direction are provided on both sides of the device guide portion 171a, and the core clamps 172 are held in the core clamp holders 171e. The core clamp holder 171e comprises, as shown in FIG. 8, a stopper face 171f provided substantially perpendicular with the direction that the hook portion 172a engages with the hook receiver 185 and a torsion spring attachment face 171g facing to the stopper face 171f. The through hole 172d of the core clamp 172 held in the core clamp holder 171e is inserted with one end 173a of the torsion spring 173 as shown in FIG. 7 and FIG. 10(a), and the other end 173b of the torsion spring is attached to the torsion spring attachment face 171g as shown in FIG. 10(a). At this time, since the torsion spring 173 is in the twisted state, the torsion spring biases the hook portion 172a in the direction for engaging with the hook receiver 185 but rotation movement of the hook portion 172a in the direction for engaging with the hook receiver 185 is limited by the stopper face 171f as shown in FIG. 10(a).

When attaching the guide core 18 to the insert body 17, the hook portion 172a held by the stopper face 171f is brought to engage with the hook receiver 185 of the guide core 18 by the procedure below. First, the shaft GF of the jig G shown in FIG. 15 is inserted to the core clamp holder 171e from the upper end opening of the core clamp holder 171e. Note that since the lever plate 19 is provided with the through hole 193 connected to the core clamp holder 171e, the shaft GF of the jig G can be inserted to the core clamp holder 171e even in the state that the lever plate 19 is attached to an upper side of the body portion 171 of the insert body 17. When the hook portion 172a is held on the stopper face 171f, the flat plate shaped jig receiver 172b inclines downward to the direction that the hook portion 172 engages with the hook receiver 185 (that is, the direction toward the stopper face 171f from the torsion spring attachment face 171g) as shown in FIG. 10(a) and positions so as to block insertion of the shaft GF of the jig G. Thus, the shaft GF of the jig G entered from the upper end opening of the core clamp holder 171e contacts the jig receiver 172b and slides on the jig receiver 172b to press against the jig receiver 172b downward. As a result, the jig receiver 172b rotates toward the torsion spring attachment face 171g as shown in FIG. 10(b). As the jig receiver 172b rotates, the hook portion 172a rotates in the direction for releasing the engagement with the hook receiver 185 and becomes a state of being able to engage with (released from) the hook receiver 185. When the shaft GF of the jig G is receded from the core clamp holder 171e after inserting the hook portion 172a to the hook insertion hole 186 of the guide core 18 in this state, the pressing force applied to the jig receiver 172b is released and the hook portion 172a rotates to the direction for engaging with the hook receiver 185 due to the biasing force of the torsion spring as shown in FIG. 10(c). As a result, the hook portion 172a engages with the hook receiver 185 and the guide core 18 is attached to the insert body 17.

The same procedure is followed when detaching from the insert body 17 the guide core 18 attached to the insert body 17. Namely, when the shaft GF of the jig G is inserted to the core clamp holder 171e from the upper end opening of the core clamp holder 171e, the hook portion 172a rotates to the direction for releasing the engagement with the hook receiver 185 along with the rotation movement of the jig receiver 172b to be in a state of being able to be detached from the hook receiver 185. By making the hook portion 172a receding from the hook insertion hole 186 of the guide core 18 in this state, the engagement of the hook portion 172a with the hook receiver 185 is released and the guide core 18 is detached from the insert body 17.

Figure 11:
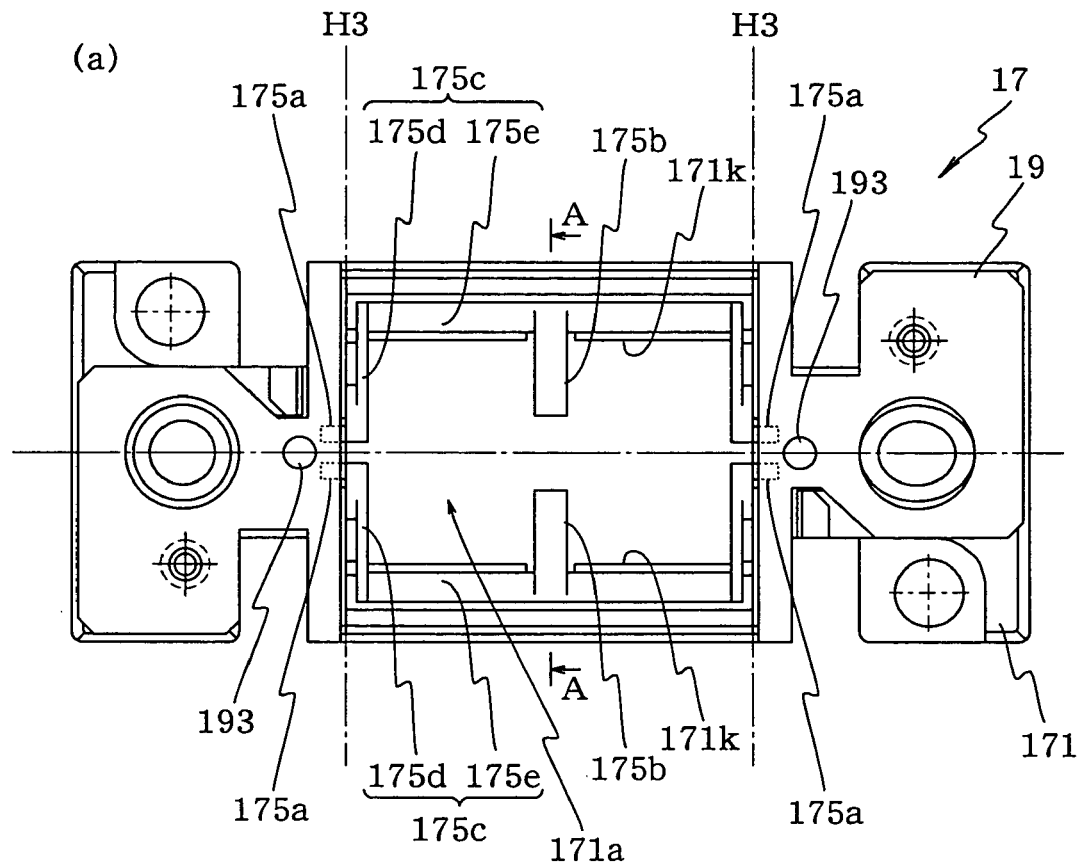
FIG. 11(a) is a view from the above of the insert body.
FIG. 11(b) is a sectional view along the line A—A in FIG. 11(a).
Figure 11:
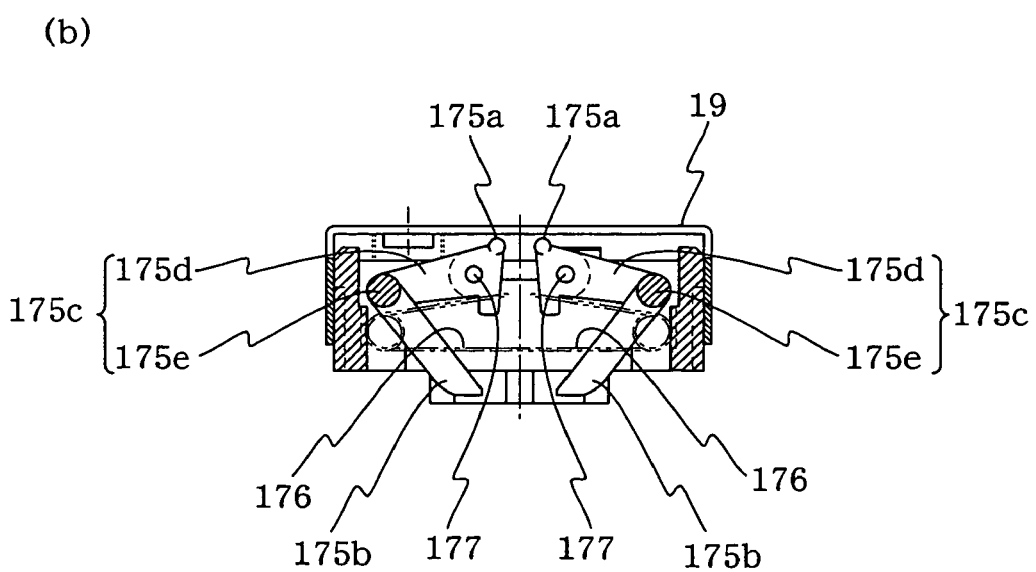

The body portion 171 of the insert body 17 is provided with a latch mechanism L comprising latches 175, torsion springs 176 and shafts 177 as shown in FIG. 7 and FIG. 11.

The latch 175 comprises, as shown in FIG. 7 and FIG. 11, a lever plate action portion 175a, a latch portion 175b and an arm 175c connecting the lever plate action portion 175a and the latch portion 175b.

The arm 175c is composed of a second arm 175e and two first arms 175d provided facing to each other at both ends of the second arm 175e as shown in FIG. 7 and FIG. 11, and when the second arm 175e is held inside the device guide portion 171a along the longitudinal inner surface of the device guide portion 171a as shown in FIG. 11, the first arms 175d are held inside the device guide portion 171a along the short sides of the inner surface of the device guide portion 171a.

At the end of each of the facing two first arms 175d, a lever plate action portion 175a is provided to be extending in the opposite direction of the extending direction of the second arms 175e as shown in FIG. 7 and FIG. 11. Also, each of the facing two arms is provided with a through hole 175f, to which the shaft 177 is inserted, at a position closer to the lever plate action portion 175a than to the second arm portion 175e as shown in FIG. 7 and FIG. 11. Also, at the approximate center of the second arm 175e is provided with a latch portion 175d extending in the direction of making an acute angle with the extending direction of the first arm 175d as shown in FIG. 7 and FIG. 11.

One end of the shaft 177 is inserted to the through hole 175f of each of the facing two first arms 175d as shown in FIG. 7 and as a result that the other end of the shaft 177 is supported by a shaft supporting portion 171i of the body portion 171 of the insert body 17, the latch portion 175 is rotatably supported by the body portion 171 of the insert body 17. Two latches 175 supported in this way are provided facing to each other on the body portion 171 of the insert body 17 as shown in FIG. 7 and FIG. 11.

The shaft supporting portions 171i are provided as concave portions capable of holding ends of the shafts 177 on edge portions of short sides of the device inlet 171*b* as shown in FIG. 7 and FIG. 8. Each of the shafts 177 is supported by the shaft supporting portion 171*i* so as to be positioned near the device inlet 171*b*. Also, two shafts 177 inserted to the through holes 175*f* of the facing first arms 175*d* are supported by the shaft supporting portions 171*i* so that the rotation axes become identical and the rotation axes become approximately perpendicular with the direction (vertical direction) that the lever plate 19 moves close to and away from the insert body 17. The latches 175 are made rotatable about the shafts 177 supported as above as a rotation axis. Namely, the lever plate action portion 175*a* and the latch portion 175*b* are capable of rotating about the shaft 177 as a rotation axis, and the rotation movement of the lever plate action portion 175*a* and the rotation movement of the latch portion 175*b* are interlocked by the arm 175*c*.

On the longitudinal inner surface of the device guide portion 171*a* is provided with a base 171*k* at its lower portion as shown in FIG. 7, FIG. 8 and FIG. 11, and the downward rotation movement of the second arm 175*e* is limited as a result that the second arm 175*e* is supported by the base 171*k*. Accordingly, when the latch 175 is not affected by an action of the lever plate 19 (for example, in the case where the lever plate 19 is most distant from the insert body 17), the latch 175 is held in the state shown in FIG. 11.

When the latch 175 is held in the state shown in FIG. 11, the lever plate action portion 175*a* is positioned closer to the lever plate 19 than to a plane H1 (refer to FIG. 12) which includes the rotation axis of the shaft 177 and which is perpendicular with the direction (vertical direction) that the lever plate 19 moves close to and away from the insert body 17 (that is, the lever plate action portion 175*a* is positioned upper than the shaft 177). Accordingly, the lever plate action portion 175*a* rotates toward the plane H1 (that is, the lever plate action portion 175*a* rotates downward) by receiving an action from the lever plate 19 to the direction (downward) that the lever plate 19 moves close to the insert body 17.

Also, when the latch 175 is held in the state shown in FIG. 11, the lever plate action portion 175*a* is positioned near a plane H2 (refer to FIG. 12) which includes the rotation axis of the shaft 177 and which is in parallel with the direction (vertical direction) that the lever plate 19 moves close to and away from the insert body 17 (that is, as shown in FIG. 12, a distance X between the lever plate action portion 175*a* and the plane H2 becomes short). Accordingly, a rotation angle that the lever plate action portion 175*a* can rotate toward the plane H1 becomes large.

Also, when the latch 175 is held in the state shown in FIG. 11, the lever plate action portion 175*a* is positioned near the lever plate 19 in the most distant state (in a state of being the most distant from the insert body 17). Accordingly, a distance that the lever plate 19 moves downward while giving an action to the lever plate action portion 175*a* becomes long, and the rotation angle that the lever plate action portion 175*a* can rotate becomes large as a result of receiving an action of the lever plate 19.

Also, when the latch 175 is held in the state shown in FIG. 11, the latch portion 175*d* is at a position of making the device guide portion 171*a* closed (a closed position). That is, since the latch portion 175*b* is positioned as crossing over the device guide portion 171*a* from the longitudinal inner surface of the device guide portion 171*a* to the approximate center portion of the guide core attachment socket 171*c*, the IC device is unable to pass through the device guide portion 171*a* and the state where the IC device cannot be carried in or out from the guide core 18 by guiding by the device guide portion 171*a* is attained.

Also, when the latch 175 is held in the state shown in FIG. 11, the lever plate action portion 175*a* and the latch portion 175*b* are positioned on opposite sides of the plane H1. Accordingly, when the lever plate action portion 175*a* rotates downward, the latch portion 175*b* rotates upward (that is, the latch portion 175*b* rotates from the closed position to the open position).

Also, when the latch 175 is held in the state shown in FIG. 11, the end of the latch portion 175*b* is positioned close to the plane H2 and near the guide core attachment socket 171*c*. As a result that the end of the latch portion 175*b* at the closed position is positioned as such, a moving distance of the end of the latch portion 175*b* becomes long (that is, an opening/closing amount of the latch portion 175*b* is large).

When the lever plate action portion 175*a* receives an action from the lever plate 19, the latch portion 175*d* at the closed position (refer to FIG. 12(*a*)) moves to the open position (refer to FIG. 12(*b*)) by following the mechanism below. When the lever plate 19 moves downward, the lever plate 19 contacts the lever plate action portion 175*a* and presses the lever plate action portion 175*a* downward. The lever plate action portion 175*a* rotate downward by receiving the downward pressing force from the lever plate 19. The lever plate action portion 175*a* continues to rotate until being held in the concave portion 171*p* provided at an edge of the device inlet 171*b*. The lever plate action portion 175*a* is capable of rotating without interfering with the body portion 171 of the insert body 17 as a result of being held in the concave portion 171*p*. The first arm 175*d* rotates due to the rotation movement of the lever plate action portion 175*a*, and the second arm 175*e* rotates to the opposite direction (upward) from that of the lever plate action portion 175*a* due to the rotation of the first arm 175*d*. Along with the rotation movement of the second arm 175*e*, the latch portion 175*b* also rotates upward. At this time, the end of the latch portion 175*b* rotates from the approximate center portion of the guide core attachment socket 171*c* toward the longitudinal inner surface of the device guide portion 171*a* to be held in a latch portion holder 171*r* formed on the base 171*k* provided on the lower portion of the inner surface. In this way, the latch portion 175*b* moves to the position of making the device guide portion 171*a* in an open state (an open position) as shown in FIG. 12(*b*). Namely, the IC device is able to pass through the device guide portion 171*a* and the state where the IC device can be carried in and out from the guide core 18 by being guided by the device guide portion 171*a* can be attained. In the example shown in FIG. 12, a downward moving amount of 1.5 mm of the lever plate 19 can be converted to an opening/closing amount of 4.7 mm of the latch portion 175*b*.

When the latch 175 is held in the state shown in FIG. 11, the lever plate action portion 175*a* and the first arm 175*d*/the second arm 175*e* are positioned on the opposite sides of a plane H3 (refer to FIG. 11) which is perpendicular with the rotation axis of the shaft 177 and which is in parallel with the direction that the lever plate 19 moves close to and away from the insert body 17, so that an orbit of the lever plate action portion 175*a* and orbits of the first arm 175*d* and the second arm 175*e* drawn by the movement of the lever plate 19 are positioned on the opposite sides of the plane H3. Accordingly, the lever plate 19 is able to act only on the lever plate action portion 175*a* without acting on the arm 175*c* by the rim portion of the opening 192 formed a little larger than the device inlet 171*b*. Accordingly, as the lever plate 19 approaches the insert body 17, the arm 175c moves from inside the device guide portion 171a to outside the device guide portion 171a (above the device inlet 171b) through the device inlet 171b but the lever plate 19 does not interfere with the arm 175c. Namely, the rotation movement of the lever plate action portion 175a and the rotation movement of the latch portion 175b are surely interlocked by the arm 175c.

On the inner surface in the short side direction of the device guide portion 171a is provided with a spring fixing portion 171j at its lower portion as shown in FIG. 7, FIG. 8 and FIG. 11, and the lever plate action portion 175a is biased upward by the torsion spring 176 fixed to the spring fixing portion 171j. Accordingly, when the lever plate 19 moves upward and the lever plate 19 releases a downward pressing force against the lever plate action portion 175a, the lever plate action portion 175a is biased upward by the torsion spring 176 and rotates upward. As a result, the latch portion rotates from the open position to the closed position.

When an IC device to be tested is reloaded form a customer tray KST to a test tray TST by a suction head of the X-Y conveyor 304, the suction head presses the lever plate 19 downward (in the direction that the lever plate 19 moves close to the insert body 17). As a result, the lever plate 19 moves downward to press the lever plate action portion 175a downward. The lever plate action portion 175a rotates downward by receiving the action from the lever plate 19 and the latch portion 175b rotates from the closed position to the open position along therewith. As a result, the IC device to be tested becomes to be in a state of being able to be guided by the device guide portion 171a and carried to the guide core 18, and the IC device to be tested picked by the suction head of the X-Y conveyor 304 is carried into the guide core 18. After carrying the IC device to be tested into the guide core 18, the suction head of the X-Y conveyor 304 is separated from the insert body 17. Consequently, the pressing force on the lever plate 19 by the suction head is released and the lever plate 19 moves away from the insert body 17. Thus, the pressing force on the lever plate action portion 175a by the lever plate 19 is released. The lever plate action portion 175a rotates upward by receiving an upward biasing force from the torsion spring 176 and the latch portion 175b moves from the open position to the closed position along therewith. As a result, the IC device to be tested supported by the guide core 18 is prevented from jumping out of the insert. Also, the end of the latch portion 175b at the closed position presses an upper surface of the IC device to be tested supported by the guide core 18, so that positional deviation of the IC device to be tested is prevented.

As shown in FIG. 13 and FIG. 14, on both sides of the insert 16 are formed guide holes 20, to which a guide pin 32 of a pusher 30 is inserted from above and a guide bush 411 of a socket guide 41 is inserted from below, respectively, and at corner portions on both sides of the insert 16 are formed mounting holes 21 for mounting tabs 14 of a test tray TST. Note that the configuration of the insert 16 is simplified in FIG. 13 and FIG. 14.

As shown in FIG. 13 and FIG. 14, guide holes 20 on the insert 16 are for alignment. For example, when using the guide hole 20 on the left side in the figure for aligning and making the inner diameter smaller than that of the guide hole 20 on the right side, an upper half of the guide hole 20 on the left is inserted the guide pin 32 of the pusher base 34 for aligning and a lower half thereof is inserted the guide bush 411 of the socket guide 41 for aligning. On the other hand, the guide hole 20 on the right side of the figure is in a loosely fit state with the guide pin 32 of the pusher 30 and the guide bush 411 of the socket guide 41.

As shown in FIG. 13, a socket board 50 is arranged on the test head 5. The socket board 50 can be arranged by the number corresponding to the IC devices 2, for example, in a total of four rows in every three rows in the line direction (4 lines×4 rows) on the test tray TST shown in FIG. 6, alternately, when a size of each socket board 50 can be made small, the socket board 50 may be arranged by 4 lines×16 rows on the test head 5, so that all IC devices 2 carried on the test tray TST shown in FIG. 6 can be tested at a time.

As shown in FIG. 13, a socket 40 is provided on the socket board 50 and, as shown in FIG. 13 and FIG. 14, a socket guide 41 is fixed on the socket 40 so that connection terminals 44 provided on the socket 40 are exposed. The connection terminals 44 of the socket 40 are probe pins and provided by the number and at positions corresponding to the external terminals 22 of the IC device 2 and biased in the upward direction by a not shown spring. On both sides of the socket guide 41 are provided with guide bushes 411 to which two guide pins 32 formed on the pusher 30 are inserted for aligning with the two guide pins 32.

The pusher 30 shown in FIG. 13 and FIG. 14 is provided on top of the test head 5 by the number corresponding to the number of sockets 40 and able to move up and down in the Z-axis direction by a not shown Z-axis drive (for example a fluid pressure cylinder). As shown in FIG. 13 and FIG. 14, at the approximate center of the pusher 30 is formed a pressing tab 31 for pressing the IC device to be tested 2, and on both sides thereof, guide pins 32 to be inserted to the guide holes 20 of the inert 16 and the guide bushes 411 of the socket guide 40 are provided. Also, as shown in FIG. 13 and FIG. 14, between the pressing tab 31 and the guide pin 32 is provided with a stopper guide 34 for regulating the lower limit at the time the pusher 30 is lowered by the Z-axis drive, and as a result that the stopper guide 34 contacts the stopper face 412 of the socket guide 40, the lower limit position of the pusher 30 for pressing with a suitable pressure of not breaking the IC device to be tested 2 held in the insert 16 is determined.

Fourthly, a part relating to the unloader section 400 will be explained.

The unloader section 400 shown in FIG. 2 and FIG. 3 is provided with an X-Y conveyor 404 having the same configuration with that of the X-Y conveyor 304 provided to the loader section 300. Post-test IC devices are reloaded from the test tray TST conveyed out to the unloader section 400 to a customer tray KST by the X-Y conveyor 404.

As shown in FIG. 2, a device substrate 105 of the unloader section 400 is provided with two pairs of windows 406 and 406 arranged so that the customer trays KST carried to the unloader section 400 can be brought close from below.

Further, while not illustrated, an elevator table for elevating or lowering a customer tray KST is provided below the respective openings 406. A customer tray KST becoming full after being reloaded with the post-test IC devices is placed on here and lowered and the full tray is passed to the tray transfer arm 205.

The embodiments explained above are described to facilitate understanding of the present invention and is not to limit the present invention. Accordingly, respective elements disclosed in the above embodiments include all design modifications and equivalents belonging to the technical scope of the present invention.

In the above embodiments, modifications below can be made.

Figure 16:
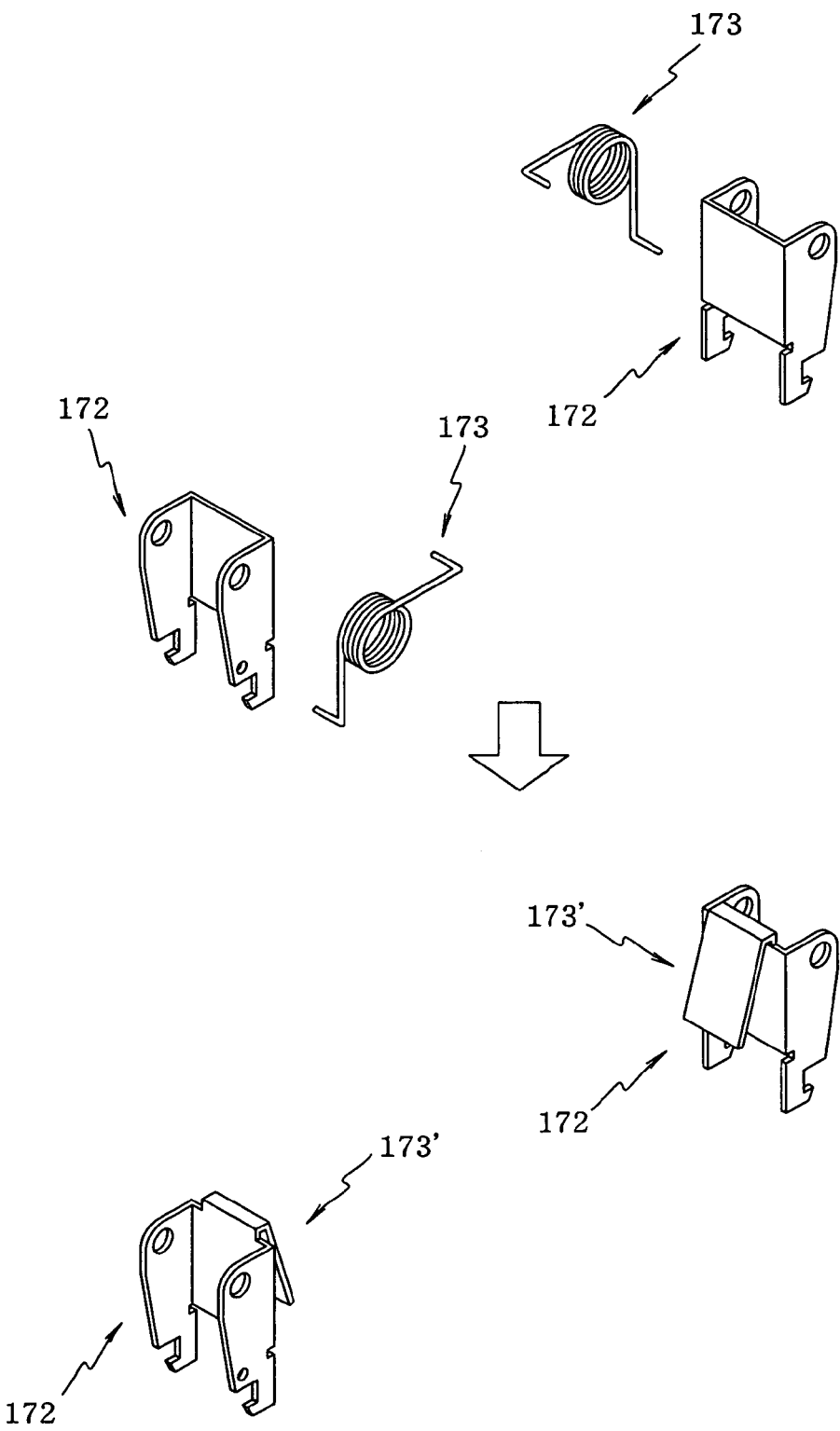
FIG. 16 is a perspective view of another embodiment of a spring in the hook mechanism.
Figure 17:
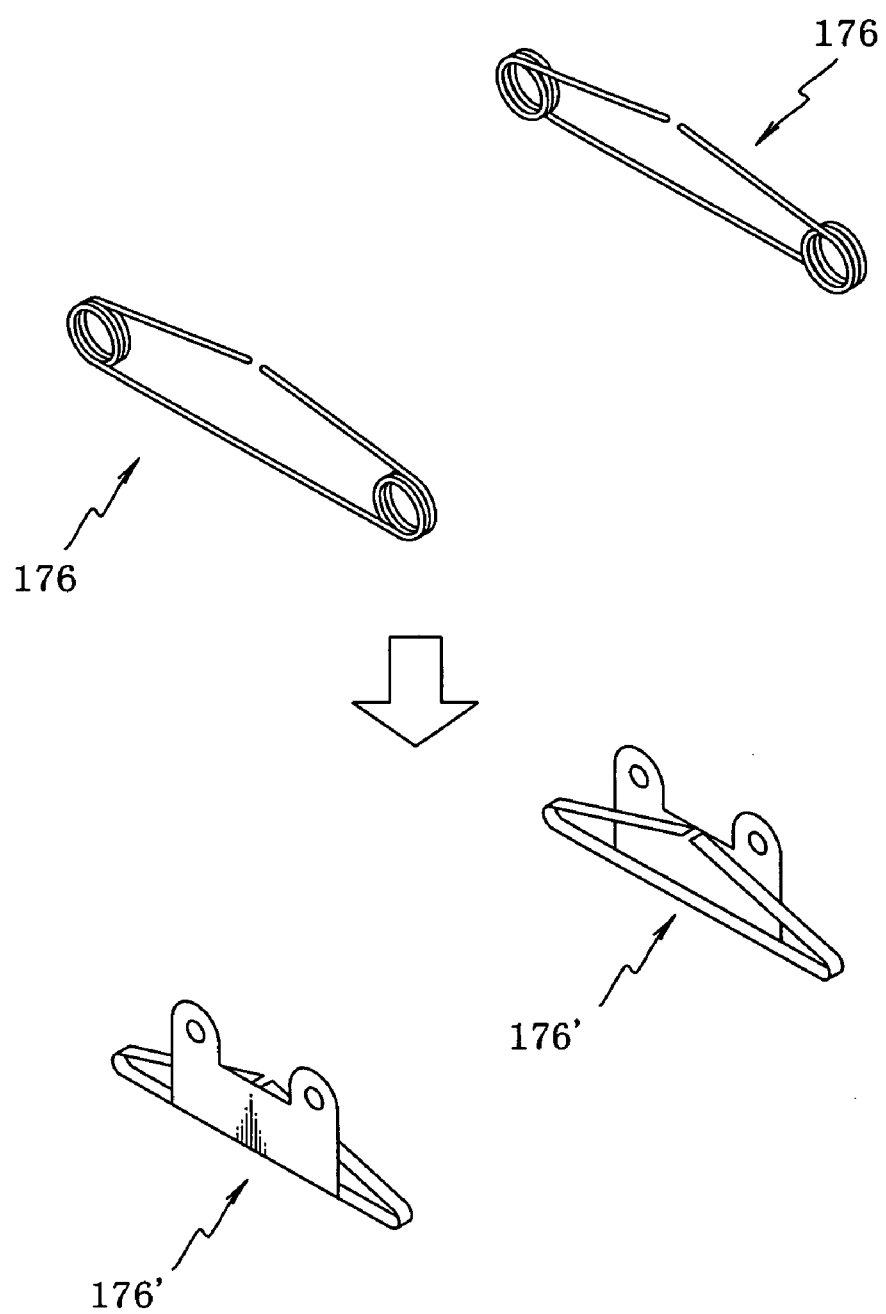
FIG. 17 is a perspective view of another embodiment of a spring in the latch mechanism.

For example, the torsion spring 173 in the hook mechanism F shown in FIG. 7 can be replaced by a leaf spring 173' formed connected to the core clamp 172 as shown in FIG. 16. Also, the torsion spring 176 in the latch mechanism L shown in FIG. 7 can be replaced by a leaf spring 176' as shown in FIG. 17. Also, the direction that the hook portion 172a engages with the hook receiver 185 in the hook mechanism F may be changed to any direction. Also, the IC device testing apparatus 10 is not limited to the chamber type explained in the above embodiment and may be, for example, a chamberless type or a heat plate type.

INDUSTRIAL APPLICABILITY

According to the present invention, at first, a guide core detachably attached to an insert body is provided. Also, according to the present invention, secondary, an insert body to which a guide core can be detachably attached is provided. Furthermore, according to the present invention, thirdly, an insert body provided with a latch mechanism having a latch portion with a large opening/closing amount and capable of dealing with a variety of sizes of IC devices is provided. Furthermore, according to the present invention, fourthly, an insert comprising the above guide core and the above insert body, and an electronic handling apparatus comprising the insert are provided.

The invention claimed is:

1. An insert body able to be attached in a detachable way with a guide core a supporting portion capable of supporting an external terminal face of an electronic component carried to the guide core while the guide core is attached to the insert body so that external terminals of the electronic component are exposed to the direction of connection terminals of a socket, and a hook receiver able to be engaged in a releasable way with a hook portion provided on the insert body, comprising:

an electronic component guide portion comprising a guide core attachment socket to which the guide core is attached, and an electronic component inlet connected with the guide core attachment socket so that an electronic component can be guided to the guide core attached to the guide core attachment socket and so that external terminals of the electronic component are exposed to the direction of connection terminals of a socket while the electronic component is supported by the supporting portion of the guide core, and a hook portion able to be engaged in a releasable way with a hook receiver provided to the guide core.

2. The insert body as set forth in claim 1, wherein the hook portion can be inserted to the hook insertion hole provided to the guide core and can engage with the hook receiver in a state of being inserted in the hook insertion hole.

3. The insert body as set forth in claim 1, comprising a holder capable of holding the driver action portion so that the driver action portion can rotate without interfering with the insert body.

4. The insert body as set forth in claim 1, wherein the hook portion can move in the direction for engaging with the hook receiver.

5. The insert body as set forth in claim 4, wherein the hook portion can rotate on a rotation axis.

6. The insert body as set forth in claim 4, wherein the hook portion is biased by an elastic member in the direction for engaging with the hook receiver.

7. The insert body as set forth in claim 6, comprising a stopper portion for limiting movement or rotation of the hook portion in the direction for engaging with the hook receiver.

8. The insert body as set forth in claim 7, comprising a jig receiver which is connected with the hook portion and can move or rotate the hook portion in the direction for releasing the engagement with the hook receiver by receiving a pressure from a jig.

9. The insert body as set forth in claim 8, comprising a jig insertion hole to which the jig can be inserted, wherein the jig inserted to the jig insertion hole can press the jig receiver.

10. The insert body as set forth in claim 9, wherein the jig inserted to the jig insertion hole can press the jig receiver as a result that the jig inserted to the jig insertion hole contacts the jig receiver and slides on the jig receiver.

11. The insert body as set forth in claim 1, comprising a latch mechanism comprising a driver action portion which can rotate by receiving an action from a driver moving close to and away from the insert body to the direction in which the driver moves close to the insert body, a latch portion which can rotate between an open position for making the electronic component guide portion to be in an open state and a closed position for making the same to be in a closed state, and an arm which can interlock rotation of the drive action portion and rotation of the latch portion, wherein when the driver is at the most distant position, the driver action portion is positioned close to the driver than to a plane which includes a rotation axis of the driver action portion and which is perpendicular with the direction in which the driver moves close to and away from the insert body, and is positioned near a plane which includes a rotation axis of the driver action portion and which is in parallel with the direction in which the driver moves close to and away from the insert body, and wherein the driver can move without interfering with the arm.

12. The insert body as set forth in claim 11, wherein the driver action portion is biased by an elastic member to the direction in which the driver moves away from the insert body.

13. The insert body as set forth in claim 11, wherein when the driver is at the most distant position, the driver action portion is positioned near the driver.

14. The insert body as set forth in claim 11, wherein when the driver action portion rotates by receiving an action from the driver to the direction in which the driver moves close to the insert body, the rotation of the driver action portion and the rotation of the latch portion are interlocked so that the latch portion can rotate from the closed position to the open position.

15. The insert body as set forth in claim 11, wherein the rotation axis of the driver action portion and the rotation axis of the latch portion are identical.

16. The insert body as set forth in claim 15, wherein when the driver is at the most distant position, the driver action portion and the latch portion are positioned on opposite sides of a plane which includes the rotation axis and which is perpendicular with the direction in which the driver moves close to and away from the insert body.

17. The insert body as set forth in claim 15, wherein the rotation axis is positioned near the electronic component inlet, and when the driver is at the most distant position, an end of the latch portion is positioned close to a plane which includes the rotation axis and which is in parallel with the direction in which the driver moves close to and away from the insert body, and is positioned near the guide core attachment socket.

18. The insert body as set forth in claim 15, wherein when the driver is at the most distant position, the driver action portion and the arm portion are positioned on opposite sides of a plane which is perpendicular with the rotation axis and which is in parallel with the direction in which the driver moves close to and away from the insert body.

19. An insert, comprising:
a guide core able to be attached in a detachable way to an insert body, comprising
   a supporting portion capable of supporting an external terminal face of an electronic component carried to the guide core while the guide core is attached to the insert body so that external terminals of the electronic component are exposed to the direction of connection terminals of a socket, and
   a hook receiver able to be engaged in a releasable way with a hook portion provided on the insert body;
an insert body able to be attached in a detachable way with the guide core comprising
   an electronic component guide portion comprising a guide core attachment socket to which the guide core is attached, and an electronic component inlet connected with the guide core attachment socket so that an electronic component can be guided to the guide core attached to the guide core attachment socket and so that external terminals of the electronic component are exposed to the direction of connecting terminals of a socket while the electronic component is supported by the supporting portion of the guide core, and
   a hook portion able to be engaged in a releasable way with a hook receiver provided to the guide core.

20. The insert as set forth in claim 19, which is attached to a tray for carrying an electronic component to be tested to and out of a contact portion of a test head of an electronic component testing apparatus.

21. An electronic component handling apparatus for conducting a test on an electronic component by connecting external terminals of the electronic component to connection terminals of a socket in a state of holding the electronic component in an insert, comprising the insert as set forth in claim 20 as the insert.

22. An electronic component handling apparatus for conducting a test on an electronic component by connecting external terminals of the electronic component to connection terminals of a socket in a state of holding the electronic component in an insert, comprising the insert as set forth in claim 19 as the insert.

* * * * *

UNITED STATES PATENT AND TRADEMARK OFFICE
CERTIFICATE OF CORRECTION

| | | |
|---|---|---|
| PATENT NO. | : 7,156,680 B2 | Page 1 of 1 |
| APPLICATION NO. | : 10/929724 | |
| DATED | : January 2, 2007 | |
| INVENTOR(S) | : Noboru Saito | |

It is certified that error appears in the above-identified patent and that said Letters Patent is hereby corrected as shown below:

Title Page, Related U.S. Application Data

Item (63) should read as:

Continuation of application No. PCT/JP02/02084 filed on March 6, 2002.

Signed and Sealed this

Tenth Day of April, 2007

JON W. DUDAS
*Director of the United States Patent and Trademark Office*